United States Patent
Choi et al.

(10) Patent No.: US 12,007,643 B2
(45) Date of Patent: Jun. 11, 2024

(54) OPTICAL PATH CONTROL MEMBER AND DISPLAY DEVICE COMPRISING SAME

(71) Applicant: LG INNOTEK CO., LTD., Seoul (KR)

(72) Inventors: Won Seok Choi, Seoul (KR); Jin Gyeong Park, Seoul (KR); Byung Sook Kim, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 18/007,394

(22) PCT Filed: Jul. 8, 2021

(86) PCT No.: PCT/KR2021/008729
§ 371 (c)(1),
(2) Date: Jan. 30, 2023

(87) PCT Pub. No.: WO2022/025474
PCT Pub. Date: Feb. 3, 2022

(65) Prior Publication Data
US 2023/0280612 A1 Sep. 7, 2023

(30) Foreign Application Priority Data
Jul. 28, 2020 (KR) .................. 10-2020-0093955

(51) Int. Cl.
*G02F 1/1335* (2006.01)
*G02F 1/1333* (2006.01)
(Continued)

(52) U.S. Cl.
CPC .... *G02F 1/133524* (2013.01); *G02F 1/13338* (2013.01); *G02F 1/133608* (2013.01);
(Continued)

(58) Field of Classification Search
None
See application file for complete search history.

(56) References Cited

U.S. PATENT DOCUMENTS

| 3,808,769 A * | 5/1974 | Gardiner ............... G02F 1/1341 349/154 |
| 2011/0063259 A1 * | 3/2011 | Lee ....................... G02B 26/026 345/204 |

(Continued)

FOREIGN PATENT DOCUMENTS

| KR | 10-2011-0028952 A | 3/2011 |
| KR | 10-2012-0131714 A | 12/2012 |

(Continued)

OTHER PUBLICATIONS

International Search Report dated Nov. 2, 2021 in International Application No. PCT/KR2021/008729.

*Primary Examiner* — Ryan Crockett
(74) *Attorney, Agent, or Firm* — Saliwanchik, Lloyd & Eisenschenk

(57) ABSTRACT

An optical path control member according to an embodiment comprises: a first substrate on which a first direction and a second direction are defined; a first electrode arranged on the first substrate; a second substrate which is arranged on the first substrate and on which the first direction and the second direction are defined; a second electrode arranged under the second substrate; and a light conversion unit arranged between the first electrode and the second electrode, wherein the light conversion unit comprises an alternately arranged plurality of partition parts and plurality of accommodation parts, a light conversion material is arranged in the accommodation part, the accommodation part comprises at least one first region and at least one second region, and the height of the light conversion material arranged in the first region is less than the height of the light conversion material arranged in the second region.

16 Claims, 19 Drawing Sheets

(51) Int. Cl.
*G02F 1/13357* (2006.01)
*G02F 1/1339* (2006.01)
*G02F 1/1343* (2006.01)

(52) U.S. Cl.
CPC ........ *G02F 1/1339* (2013.01); *G02F 1/13439* (2013.01); *G02F 2202/28* (2013.01)

(56) References Cited

U.S. PATENT DOCUMENTS

2017/0090237 A1* 3/2017 Kim .................... G02F 1/13471
2017/0123265 A1* 5/2017 Wang ................ G02F 1/133377
2021/0373403 A1* 12/2021 Kim .................... G02B 26/023

FOREIGN PATENT DOCUMENTS

| KR | 10-2017-0012753 A | 2/2017 |
| KR | 10-2017-0054918 A | 5/2017 |
| KR | 10-2018-0004879 A | 1/2018 |
| KR | 10-2020-0028078 A | 3/2020 |

* cited by examiner

Fig. 25
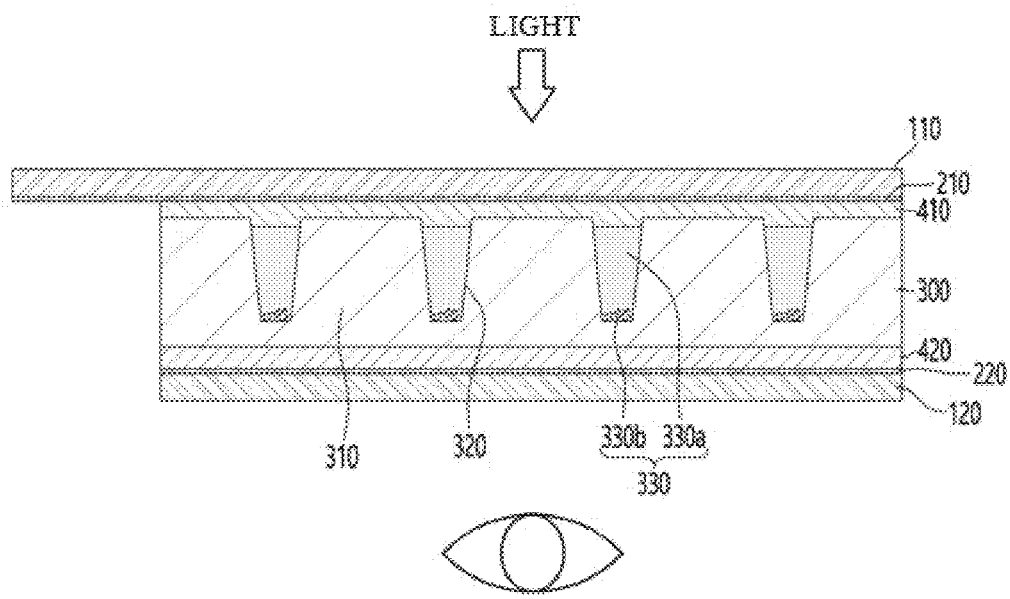
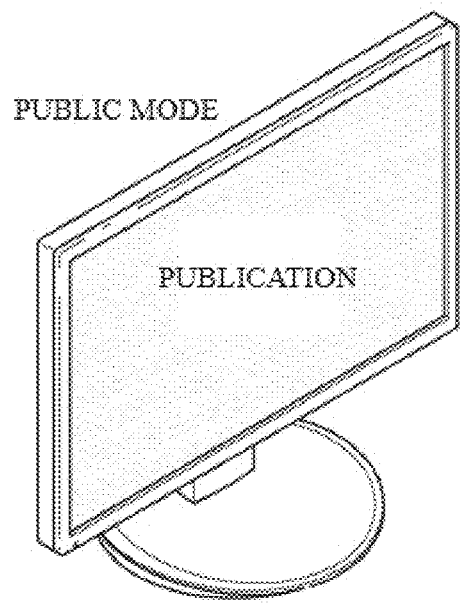

Fig. 26
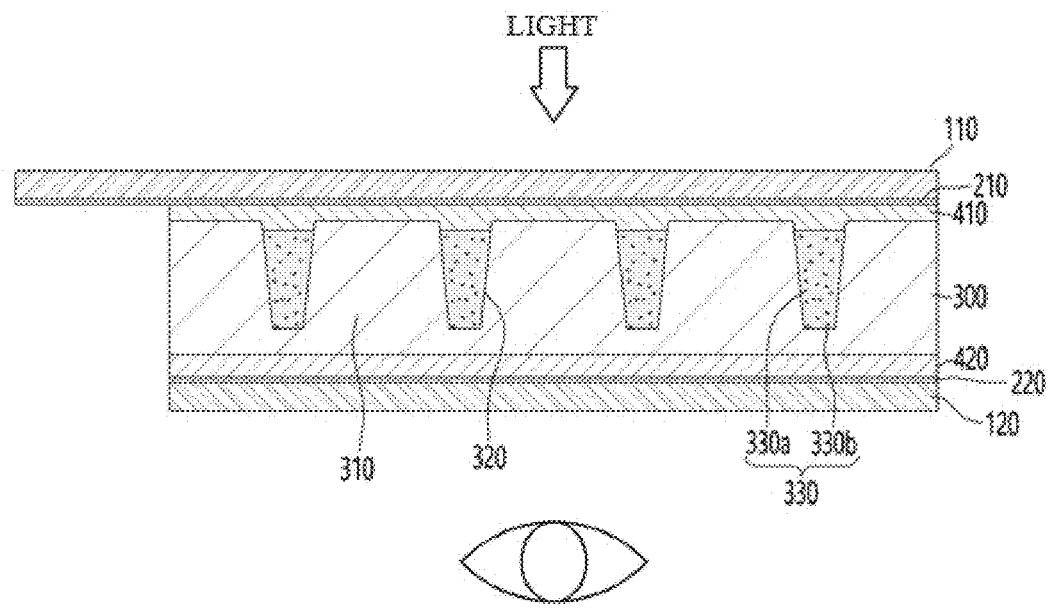
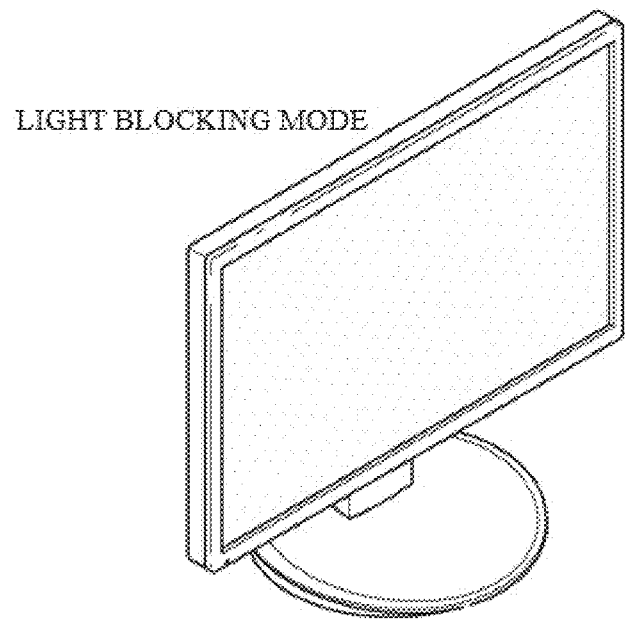
LIGHT BLOCKING MODE

OPTICAL PATH CONTROL MEMBER AND DISPLAY DEVICE COMPRISING SAME

CROSS-REFERENCE TO RELATED APPLICATIONS

This application is the U.S. national stage application of International Patent Application No. PCT/KR2021/008729, filed Jul. 8, 2021, which claims the benefit under 35 U.S.C. § 119 of Korean Application No. 10-2020-0093955, filed Jul. 28, 2020, the disclosures of each of which are incorporated herein by reference in their entirety.

TECHNICAL FIELD

An embodiment relates to an optical path control member, and to a display device including the same.

BACKGROUND ART

A light blocking film blocks transmitting of light from a light source, and is attached to a front surface of a display panel which is a display device used for a mobile phone, a notebook, a tablet PC, a vehicle navigation device, a vehicle touch, etc., so that the light blocking film adjusts a viewing angle of light according to an incident angle of light to express a clear image quality at a viewing angle needed by a user when the display transmits a screen.

In addition, the light blocking film may be used for the window of a vehicle, building or the like to shield outside light partially to inhibit glare, or to inhibit the inside from being visible from the outside.

That is, the light blocking film may be an optical path control member that controls the movement path of light to block light in a specific direction and transmit light in a specific direction. Accordingly, it is possible to control the viewing angle of the user by controlling a transmission angle of the light by the light blocking film.

Meanwhile, such a light blocking film may be divided into a light blocking film that can always control the viewing angle regardless of the surrounding environment or the user's environment and a switchable light blocking film that allow the user to turn on/off the viewing angle control according to the surrounding environment or the user's environment.

Such a switchable light blocking film may be implemented by converting an accommodation part into a light transmitting part and a light blocking part by filling the inside of the accommodation part with particles that may move when a voltage is applied and a dispersion liquid for dispersing the particles and by dispersing and aggregating the particles.

That is, the switchable light blocking film may include a plurality of accommodation parts filled with the dispersion liquid in order to change a path of light.

The patterns are formed by filling a viscous dispersion as described above. Accordingly, there is a problem that the dispersion liquid flows out to the outside while the switchable light blocking film is in use, or impurities penetrate into the dispersion liquid, so that driving characteristics and reliability of the switchable light blocking film are deteriorated.

In addition, when the switchable light blocking film is combined with a display panel and the like to be used as a display device, a pattern of the switchable light blocking film and a pattern of the display panel may overlap to occur a moire phenomenon. Accordingly, when a user uses the display device, there is a problem that visibility is deteriorated due to moire.

Therefore, there is a need for an optical path control member having a new structure capable of solving the above problems.

DISCLOSURE

Technical Problem

An embodiment relates to an optical path control member having improved visibility and reliability, and to a display device including the same.

Technical Solution

An optical path control member according to an embodiment includes: a first substrate on which a first direction and a second direction are defined; a first electrode disposed on the first substrate; a second substrate disposed on the first substrate, and on which the first direction and the second direction are defined; a second electrode disposed under the second substrate; and a light conversion unit disposed between the first electrode and the second electrode, wherein the light conversion unit includes a plurality of partition parts and a plurality of accommodation parts alternately disposed, a light conversion material is disposed in the accommodation part, the accommodation part includes at least one first region and at least one second region, and a height of the light conversion material disposed in the first region is smaller than that of the light conversion material disposed in the second region.

Advantageous Effects

In an optical path control member according to a first embodiment, a first hole, a second hole, a third hole, and a fourth hole that pass through an entire or a portion of a second substrate, a second electrode, a buffer layer, and a light conversion unit may be formed on the second substrate.

In addition, a first sealing part and a second sealing part may be disposed inside the first hole, the second hole, the third hole, and the fourth hole, respectively.

The first sealing part and the second sealing part are disposed to seal an inlet part and an outlet part of an accommodation part for accommodating a light conversion material, and to extend along a side region of the light conversion unit, that is, a side region in a first direction.

Accordingly, it is possible to inhibit the light conversion material inside the accommodation part from flowing out to the outside of the light conversion unit by the first sealing part, and it is possible to inhibit impurities from penetrating into the light conversion unit from the outside by the first sealing part and the second sealing part, thereby improving the reliability of the optical path control member.

In addition, since the first sealing part and the second sealing part are disposed inside the holes formed on the second substrate, compared to forming the first sealing part and the second sealing part outside the light conversion unit, the size of the optical path control member may be reduced, and the sealing property of the optical path control member may be improved by inhibiting the sealing member material from being denatured by an external environment.

In addition, in the optical path control member according to the first embodiment, a first connection electrode may be disposed on a first protrusion, and a second connection electrode may be disposed on a second protrusion formed on the second substrate.

Surfaces of the first and second substrates may not entirely protrude, and the first protrusion and the second protrusion may protrude only by an area in which the first connection region and the second connection electrode may be formed.

Accordingly, the areas of the first protrusion and the second protrusion may be reduced. Therefore, when the optical path control member is coupled to a display panel and applied to a display device, other components of the display device may be disposed in regions that do not correspond to the first protrusion and the second protrusion, thereby reducing a bezel region of the display device.

That is, the optical path control member according to the first embodiment reduces the size of the bezel region where the connection electrode is disposed, thereby reducing the bezel region of the display device to which the optical path control member is applied.

In addition, the optical path control member according to the first embodiment may include regions where the heights of the light conversion materials in each of the accommodation parts are different from each other. That is, the height of the light conversion material in a region adjacent to the first sealing part may be formed to be smaller than the height of the light conversion material in the other region.

Accordingly, when the optical path control member is used, it is possible to minimize the leakage of the light conversion material disposed in the accommodation part in the direction of gravity. That is, by making the amount of the light conversion material in the region adjacent to an end region of the accommodation part smaller than in other regions, it is possible to minimize the leakage of the light conversion material disposed in the accommodation part.

In an optical path control member according to a second embodiment, an accommodation part may be disposed by tilting the accommodation part at an inclination angle of a predetermined size with respect to a second direction of a substrate.

Accordingly, when the optical path control member and a display panel are coupled to form a display device, it is possible to inhibit the occurrence of the moire phenomenon caused by overlapping a pattern of the accommodation part of the optical path controlling member and a pixel pattern of the display panel.

Accordingly, when the user views the display device from the outside, it is possible to inhibit the pattern from being viewed due to the moire phenomenon caused by the overlapping of the pattern of the accommodation part of the optical path control member and the pattern of the pixel of the display panel.

In addition, the optical path control member according to the second embodiment may inhibit an optical conversion material from flowing out to a side surface of the optical path control member as the accommodation part is inclined.

That is, since a first sealing part and a second sealing part are disposed at ends of the optical path control member in the first and second directions to seal the optical conversion material inside the accommodation part, it is possible to minimize the optical conversion material flowing out to the outside or external impurities penetrating into the optical conversion material.

In addition, by forming a region where the sealing part and the optical conversion material are mixed, adhesive properties of the sealing part may be improved by the anchor effect. Accordingly, it is possible to improve the adhesion of the sealing part to inhibit delamination, thereby improving reliability and sealing properties of the optical path control member.

DESCRIPTION OF DRAWINGS

FIGS. 25 to 27 are views for describing one embodiment of the display device to which the optical path control member according to the embodiment is applied.

[Modes of the Invention]

Figure 1:
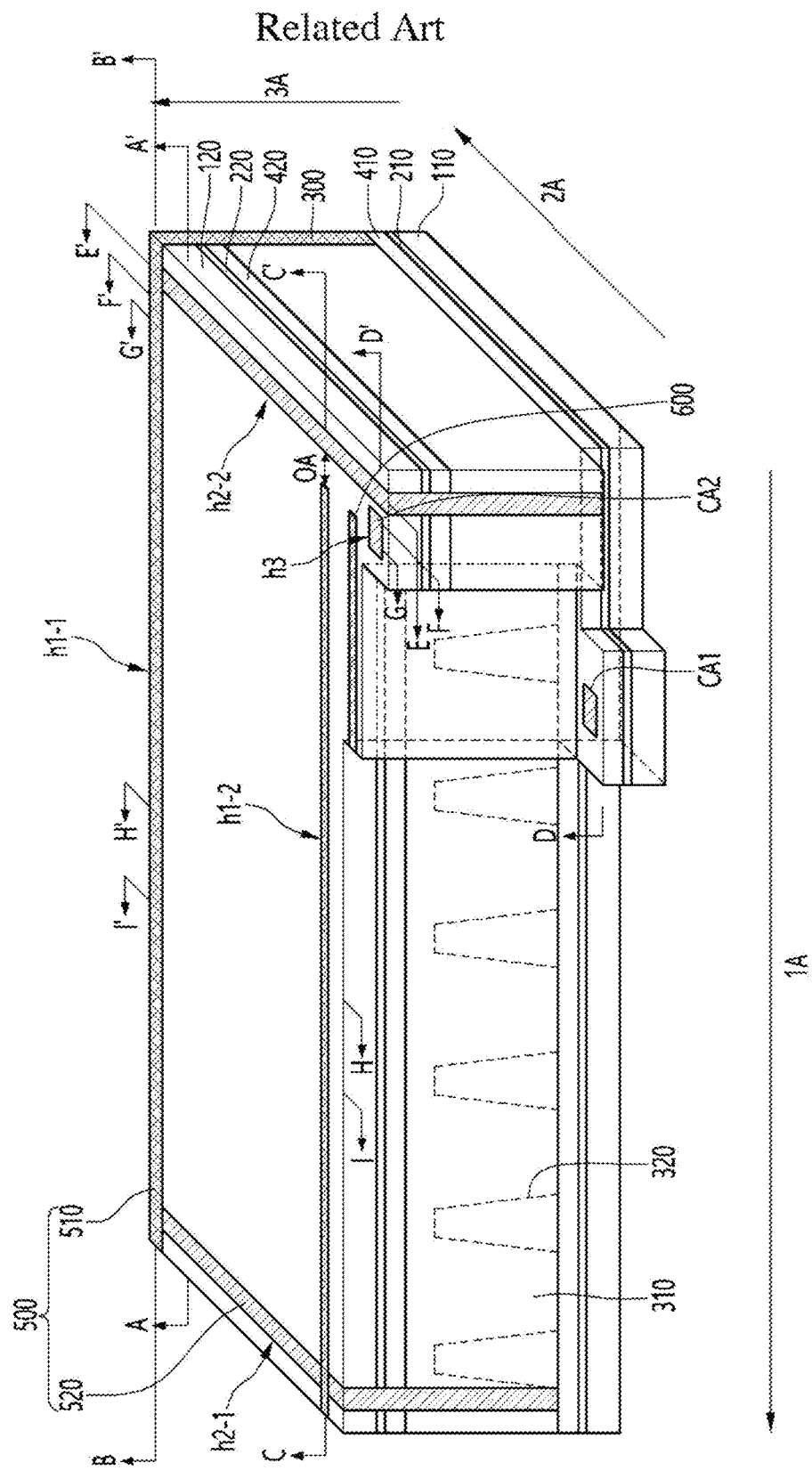
FIG. 1 is a perspective view of an optical path control member according to a first embodiment.

Hereinafter, embodiments of the present invention will be described in detail with reference to the accompanying drawings. However, the spirit and scope of the present invention is not limited to a part of the embodiments described, and may be implemented in various other forms, and within the spirit and scope of the present invention, one or more of the elements of the embodiments may be selectively combined and replaced.

In addition, unless expressly otherwise defined and described, the terms used in the embodiments of the present invention (including technical and scientific terms) may be construed the same meaning as commonly understood by one of ordinary skill in the art to which this invention belongs, and the terms such as those defined in commonly used dictionaries may be interpreted as having a meaning that is consistent with their meaning in the context of the relevant art.

In addition, the terms used in the embodiments of the present invention are for describing the embodiments and are not intended to limit the present invention. In this specification, the singular forms may also include the plural forms unless specifically stated in the phrase, and may include at least one of all combinations that may be combined in A, B, and C when described in "at least one (or more) of A (and), B, and C".

Further, in describing the elements of the embodiments of the present invention, the terms such as first, second, A, B, (a), and (b) may be used. These terms are only used to distinguish the elements from other elements, and the terms are not limited to the essence, order, or order of the elements.

In addition, when an element is described as being "connected", or "coupled" to another element, it may include not only when the element is directly "connected" to, or "coupled" to other elements, but also when the element is "connected", or "coupled" by another element between the element and other elements.

Further, when described as being formed or disposed "on (over)" or "under (below)" of each element, the "on (over)" or "under (below)" may include not only when two elements are directly connected to each other, but also when one or more other elements are formed or disposed between two elements.

Furthermore, when expressed as "on (over)" or "under (below)", it may include not only the upper direction but also the lower direction based on one element.

Hereinafter, an optical path control member according to an embodiment will be described with reference to drawings. The optical path control member described below relates to a switchable optical path control member driven in various modes according to electrophoretic particles moving by application of a voltage.

Hereinafter. An optical path control member according to a first embodiment will be described with reference to FIGS. 1 to 14.

Referring to FIGS. 1 to 17, an optical path control member 1000 according to the first embodiment may include a first substrate 110, a second substrate 120, a first electrode 210, a second electrode 220, and a light conversion unit 300.

The first substrate 110 may support the first electrode 210. The first substrate 110 may be rigid or flexible.

In addition, the first substrate 110 may be transparent. For example, the first substrate 110 may include a transparent substrate capable of transmitting light.

The first substrate 110 may include glass, plastic, or a flexible polymer film. For example, the flexible polymer film may be made of any one of polyethylene terephthalate (PET), polycarbonate (PC), acrylonitrile-butadiene-styrene copolymer (ABS), polymethyl methacrylate (PMMA), polyethylene naphthalate (PEN), polyether sulfone (PES), cyclic olefin copolymer (COC), triacetylcellulose (TAC) film, polyvinyl alcohol (PVA) film, polyimide (PI) film, and polystyrene (PS), which is only an example, but the embodiment is not limited thereto.

In addition, the first substrate 110 may be a flexible substrate having flexible characteristics.

Further, the first substrate 110 may be a curved or bended substrate. That is, the optical path control member including the first substrate 110 may also be formed to have flexible, curved, or bent characteristics. Accordingly, the optical path control member according to the embodiment may be changed to various designs.

The first substrate 110 may extend in a first direction 1A, a second direction 2A, and a third direction 3A.

In detail, the first substrate 110 may include the first direction 1A corresponding to a length or width direction of the first substrate 110, a second direction 2A extending in a direction different from the first direction 1A and corresponding to the length or width direction of the first substrate 110, and a third direction 3A extending in a direction different from the first direction 1A and the second direction 2A and corresponding to a thickness direction of the first substrate 110.

For example, the first direction 1A may be defined as the length direction of the first substrate 110, the second direction 2A may be defined as the width direction of the first substrate 110 perpendicular to the first direction 1A, and the third direction 3A may be defined as the thickness direction of the first substrate 110. Alternatively, the first direction 1A may be defined as the width direction of the first substrate 110, the second direction 2A may be defined as the length direction of the first substrate 110 perpendicular to the first direction 1A, and the third direction 3A may be defined as the thickness direction of the first substrate 110.

Hereinafter, for convenience of description, the first direction 1A will be described as the length direction of the first substrate 110, the second direction 2A will be described as the width direction of the first substrate 110, and the third directions 3A will be described as the thickness direction of the first substrate 110.

The first electrode 210 may be disposed on one surface of the first substrate 110. In detail, the first electrode 210 may be disposed on an upper surface of the first substrate 110. That is, the first electrode 210 may be disposed between the first substrate 110 and the second substrate 120.

The first electrode 210 may include a transparent conductive material. For example, the first electrode 210 may include a conductive material having a light transmittance of about 80% or more. For example, the first electrode 210 may include a metal oxide such as indium tin oxide, indium zinc oxide, copper oxide, tin oxide, zinc oxide, titanium oxide, etc.

The first electrode 210 may have a thickness of 10 nm to 300 nm.

Alternatively, the first electrode 210 may include various metals to realize low resistance. For example, the first electrode 210 may include at least one metal of chromium (Cr), nickel (Ni), copper (Cu), aluminum (Al), silver (Ag), molybdenum (Mo). Gold (Au), titanium (Ti), and alloys thereof.

The first electrode 210 may be disposed on the entire surface of one surface of the first substrate 110. In detail, the first electrode 210 may be disposed as a surface electrode on one surface of the first substrate 110. However, the embodiment is not limited thereto, and the first electrode 210 may be formed of a plurality of pattern electrodes having a uniform pattern such as a mesh or stripe shape.

For example, the first electrode 210 may include a plurality of conductive patterns. In detail, the first electrode 210 may include a plurality of mesh lines crossing each other and a plurality of mesh openings formed by the mesh lines.

Accordingly, even though the first electrode 210 includes a metal, the first electrode 210 is not visually recognized from the outside, so that visibility may be improved. In addition, the light transmittance is increased by the openings, so that the brightness of the optical path control member according to the embodiment may be improved.

The second substrate 120 may be disposed on the first substrate 110. In detail, the second substrate 120 may be disposed on the first electrode 210 on the first substrate 110.

The second substrate 120 may include a material capable of transmitting light. The second substrate 120 may include a transparent material. The second substrate 120 may include a material the same as or similar to that of the first substrate 110 described above.

For example, the second substrate 120 may include glass, plastic, or a flexible polymer film. For example, the flexible polymer film may be made of any one of polyethylene terephthalate (PET), polycarbonate (PC), acrylonitrile-butadiene-styrene copolymer (ABS), polymethyl methacrylate (PMMA), polyethylene naphthalate (PEN), polyether sulfone (PES), cyclic olefin copolymer (COC), triacetylcellulose (TAC) film, polyvinyl alcohol (PVA) film, polyimide (PI) film, and polystyrene (PS). This is only an example, but the embodiment is not limited thereto.

In addition, the second substrate 120 may be a flexible substrate having flexible characteristics.

Further, the second substrate 120 may be a curved or bended substrate. That is, the optical path control member including the second substrate 120 may also be formed to have flexible, curved, or bent characteristics. Accordingly, the optical path control member according to the embodiment may be changed to various designs.

The second substrate 120 may also extend in the first direction 1A, the second direction 2A, and the third direction 3A in the same manner as the first substrate 110 described above.

In detail, the second substrate 120 may include the first direction 1A corresponding to a length or width direction of the second substrate 120, the second direction 2A extending in a direction different from the first direction 1A and corresponding to the length or width direction of the second substrate 120, and the third direction 3A extending in the direction different from the first direction 1A and the second direction 2A and corresponding to the thickness direction of the second substrate 120.

For example, the first direction 1A may be defined as the length direction of the second substrate 120, the second direction 2A may be defined as the width direction of the second substrate 120 perpendicular to the first direction 1A, and the third direction 3A may be defined as the thickness direction of the second substrate 120.

Alternatively, the first direction 1A may be defined as the width direction of the second substrate 120, the second direction 2A may be defined as the length direction of the second substrate 120 perpendicular to the first direction 1A, and the third direction 3A may be defined as the thickness direction of the second substrate 120.

Hereinafter, for convenience of description, the first direction 1A will be described as the length direction of the second substrate 120, the second direction 2A the second direction 2A will be described as the width direction of the second substrate 120, and the third directions 3A will be described as the thickness direction of the second substrate 120.

The second electrode 220 may be disposed on one surface of the second substrate 120. In detail, the second electrode 220 may be disposed on a lower surface of the second substrate 120. That is, the second electrode 220 may be disposed on one surface of the second substrate 120 in which the second substrate 120 and the first substrate 110 face each other. That is, the second electrode 220 may be disposed to face the first electrode 210 on the first substrate 110. That is, the second electrode 220 may be disposed between the first electrode 210 and the second substrate 120.

The second electrode 220 may include a material the same as or similar to that of the first substrate 110 described above.

The second electrode 220 may include a transparent conductive material. For example, the second electrode 220 may include a conductive material having a light transmittance of about 80% or more. As an example, the second electrode 220 may include a metal oxide such as indium tin oxide, indium zinc oxide, copper oxide, tin oxide, zinc oxide, titanium oxide, etc.

The second electrode 220 may have a thickness of about 10 nm to about 300 nm.

Alternatively, the second electrode 220 may include various metals to realize low resistance. For example, the second electrode 220 may include at least one metal of chromium (Cr), nickel (Ni), copper (Cu), aluminum (Al), silver (Ag), molybdenum (Mo). Gold (Au), titanium (Ti), and alloys thereof.

The second electrode 220 may be disposed on the entire surface of one surface of the second substrate 120. However, the embodiment is not limited thereto, and the second electrode 220 may be formed of a plurality of pattern electrodes having a uniform pattern such as a mesh or stripe shape.

For example, the second electrode 220 may include a plurality of conductive patterns. In detail, the second electrode 220 may include a plurality of mesh lines crossing each other and a plurality of mesh openings formed by the mesh lines.

Accordingly, even though the second electrode 220 includes a metal, the second electrode 220 is not visually recognized from the outside, so that visibility may be improved. In addition, the light transmittance is increased by the openings, so that the brightness of the optical path control member according to the embodiment may be improved.

A hole may be formed on the second substrate 120. In detail, the second substrate 120 may include a plurality of holes.

Referring to FIG. 1, the second substrate 120 may include a first hole h1-1, a second hole h1-2, a third hole h2-1, and a fourth hole h2-2.

The first hole h1-1, the second hole h1-2, the third hole h2-1, and the fourth hole h2-2 may be grooves partially passing through the optical path control member. The first hole h1-1, the second hole h1-2, the third hole h2-1, and the fourth hole h2-2 may extend from the second substrate 120 toward the first substrate 110.

At least one of the first hole h1-1, the second hole h1-2, the third hole h2-1, and the fourth hole h2-2 may be formed in a shape in which a long width and/or a short width are narrowed while extending from the second substrate 120 toward the first substrate 110. The first hole h1-1 and the second hole h1-2 may be disposed to face each other. In detail, the first hole h1-1 and the second hole h1-2 may extend in the first direction 1A of the second substrate 120, and the first hole h1-1 and the second hole h1-2 may be disposed to face each other. That is, the first hole h1-1 and the second hole h1-2 may extend in the length direction of the second substrate 120, and the first hole h1-1 and the second holes h1-2 may be disposed to face each other.

The first hole h1-1 and the second hole h1-2 may have the same shape and area. Alternatively, the first hole h1-1 and the second hole h1-2 may have different shapes and/or areas.

At least one of the first hole h1-1 and the second hole h1-2 may be disposed to be spaced apart from or in contact with both ends of the second substrate 120.

One of the first hole h1-1 and the second hole h1-2 may be an inlet part in which a light conversion material is injected into the accommodation part of the light conversion unit 300. In addition, the other one of the first hole h1-1 and the second hole h1-2 may be an outlet part through which the light conversion material injected into the accommodation part of the light conversion unit 300 exits.

Hereinafter, for convenience of description, the first hole h1-1 will be described as an inlet part and the second hole h1-2 will be described as an outlet part.

The third hole h2-1 and the fourth hole h2-2 may be disposed to face each other. In detail, the third hole h2-1 and the fourth hole h2-2 may extend in the second direction 2A of the second substrate 120, and the third hole h2-1 and the fourth hole h2-2 may be disposed to face each other. That is, the third hole h2-1 and the fourth hole h2-2 may extend in the width direction of the second substrate 120, and the third hole h2-1 and the fourth hole h2-2 may be disposed to face each other.

The third hole h2-1 and the fourth hole h2-2 may have the same shape and area. Alternatively, the third hole h2-1 and the fourth hole h2-2 may have different shapes and/or areas.

At least one of the third hole h2-1 and the fourth hole h2-2 may be disposed to be spaced apart from or in contact with both ends of the second substrate 120.

Accordingly, the first hole h1-1, the second hole h1-2, the third hole h2-1, and the fourth hole h2-2 may be disposed to extend along an edge of the second substrate 120.

At least two of the first hole h1-1, the second hole h1-2, the third hole h2-1, and the fourth hole h2-2 may be connected to each other. In addition, at least two of the first hole h1-1, the second hole h1-2, the third hole h2-1, and the fourth hole h2-2 may be disposed to be spaced apart from each other.

For example, referring to FIG. 1, the first hole h1-1 may be connected to the third hole h2-1 and the fourth hole h2-2, the second hole h1-2 may be connected to the third hole h2-1, the third hole h2-1 may be connected to the first hole h1-1 and the second hole h1-2, and the fourth hole h2-2 may be connected to the first hole h1-1. Accordingly, the second hole h1-2 and the fourth hole h2-2 may be disposed to be spaced apart from each other.

Accordingly, an open region OA formed between the second hole h1-2 and the fourth hole h2-2 may be formed in the second substrate 120.

A current and a voltage applied from an electrode connection portion 700 of a second connection region CA2 by the open region OA may be transmitted in a direction of the accommodation part 320 of the light conversion unit 300 through the second electrode 220.

Meanwhile, at least one of the first hole h1-1, the second hole h1-2, the third hole h2-1, and the fourth hole h2-2 may be formed in the second substrate 120. That is, all of the first hole h1-1, the second hole h1-2, the third hole h2-1, and the fourth holes h2-2 may be formed in the second substrate 120, or some of the first hole h1-1, the second hole h1-2, and the third hole 2-1, and the fourth hole h2-2 may be omitted, and only at least one may be formed. The number of the holes may vary depending on a manufacturing process of the optical path control member.

The first hole h1-1, the second hole h1-2, the third hole h2-1, and the fourth hole h2-2 may be formed through the second substrate 120. In addition, the first hole h1-1, the second hole h1-2, the third hole h2-1, and the fourth hole h2-2 may be formed to pass through at least one of the second substrate 120, the second electrode 220, and the light conversion unit 300. Penetration depths of the first hole h1-1, the second hole h1-2, the third hole h2-1 and the fourth hole h2-2 will be described in detail below.

In addition, a sealing material may be disposed in the first hole h1-1, the second hole h1-2, the third hole h2-1, and the fourth hole h2-2. Accordingly, the sealing material may be disposed inside the first hole h1-1, the second hole h1-2, the third hole h2-1, and the fourth hole h2-2 to form a sealing part 500.

That is, a first sealing part 510 may be disposed on the first hole h1-1 and the second hole h1-2, and a second sealing part 520 may be disposed on the third hole h2-1 and the fourth hole h2-2.

Meanwhile, in order to minimize a bezel region of the optical path control member, in at least one of the first hole h1-1, the second hole h1-2, and the third hole h2-1, and the fourth hole h2-2, a part of the hole may be the outermost surface of the optical path control member by removing an entire or a portion of at least one outer surface of the hole and from an outer surface of the hole to an outer surface of the substrate.

For example, since an open region is formed by removing from the outer surface of the hole to the outer surface of the second substrate, the outermost portion of the optical path controlling member in the open region may be a part of the hole, that is, the sealing part may be the outermost surface of the optical path controlling member. Accordingly, at least one of the first sealing part 510 and the second sealing part 520 may be the outermost surface of the optical path control member.

The sealing part 500 disposed inside the holes will be described in detail below.

The first substrate 110 and the second substrate 120 may have the same or different sizes. That is, the first substrate 110 and the second substrate 120 may have lengths corresponding to each other and different areas.

In detail, a first length extending in the first direction 1A of the first substrate 110 may have a size the same as or similar to a second length extending in the first direction 1A of the second substrate 120.

For example, the first length and the second length may have a size of 300 mm to 400 mm.

In addition, a first width extending in the second direction 2A of the first substrate 110 may have a size the same as or similar to a second width extending in the second direction of the second substrate 120.

For example, the first width and the second width may have a size of 150 mm to 200 mm.

In addition, a first thickness extending in the third direction 3A of the first substrate 110 may have a size the same as or similar to a second thickness extending in the third direction of the second substrate 120.

For example, the first thickness and the second thickness may have a size of 1 mm or less.

In addition, the first substrate 110 and the second substrate 120 may have different areas.

Figure 2:
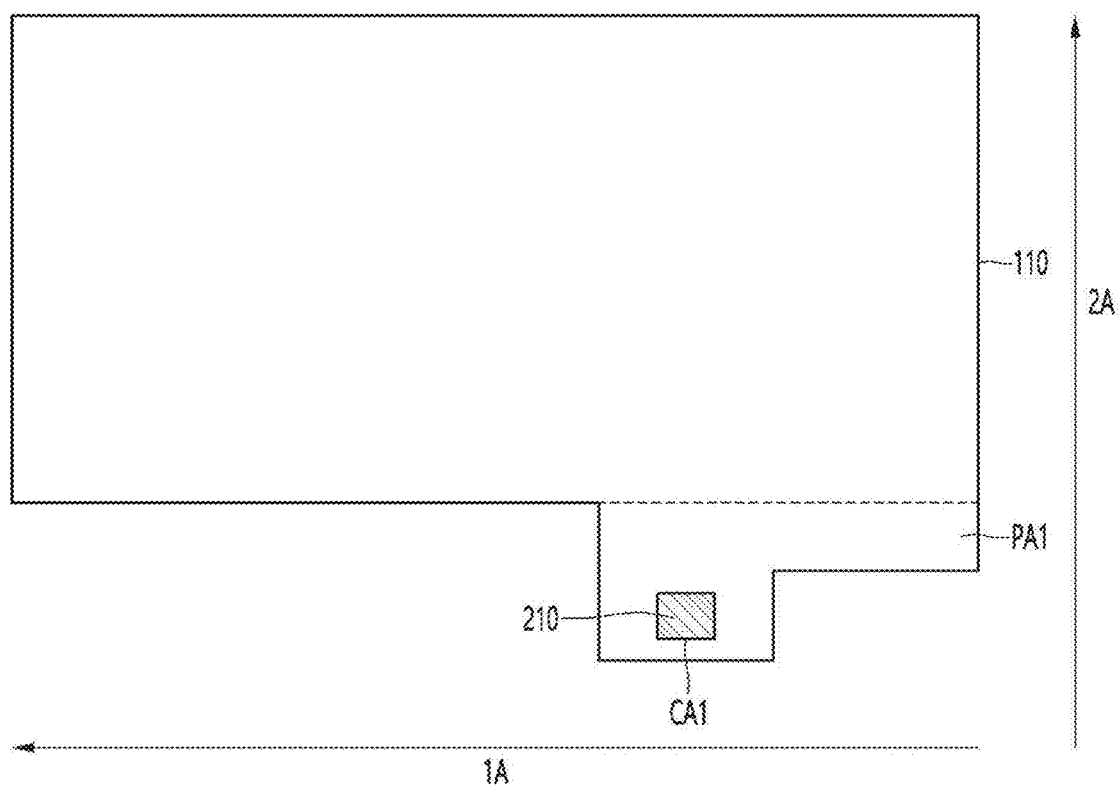
FIG. 2 is a top view of a first substrate of the optical path control member according to the first embodiment.
Figure 3:
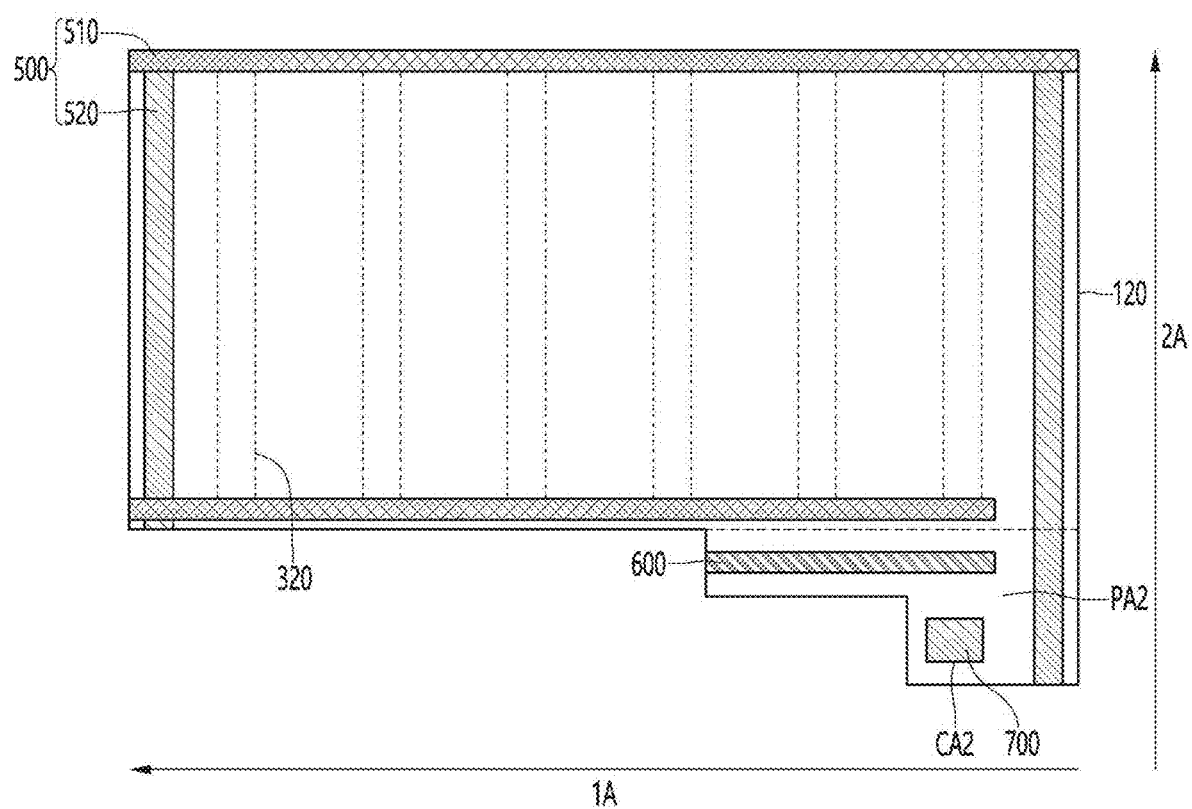
FIG. 3 is a top view of a second substrate of the optical path control member according to the first embodiment.

In detail, the first substrate 110 and the second substrate 120 may include a protrusion. Referring to FIGS. 2 and 3, the first substrate 110 may include a first protrusion PA1, and the second substrate 120 may include a second protrusion PA2. In detail, the first substrate 110 and the second substrate 120 may include the first protrusion PA1 and the second protrusion PA2 that are disposed to be misaligned from each other, respectively.

Alternatively, the embodiment is not limited thereto, and the first protrusion PA1 and the second protrusion PA2 may include an overlapping region overlapping each other and a non-overlapping region not overlapping each other. That is, the first protrusion PA1 and the second protrusion PA2 may include the overlapping region overlapping each other and the non-overlapping region not overlapping each other in the third direction.

In this case, the first protrusion PA1 and the second protrusion PA2 may have different areas. That is, the first substrate 110 and the second substrate 120 may have different sizes by a difference in size of the protrusions.

A connection region connected to an external printed circuit board or a flexible printed circuit board may be formed in the first protrusion PA1 of the first substrate 110 and the second protrusion PA2 of the second substrate 120, respectively.

In detail, a first connection region CA1 may be disposed on the first protrusion PA1, and a second connection region CA2 may be disposed on the second protrusion PA2. When the first protrusion PA1 and the second protrusion PA2 are disposed at positions misaligned from each other, the first connection region CA1 and the second connection region CA2 may be disposed so as not to overlap in the third direction 3A.

The first connection region CA1 and the second connection region CA2 may be disposed on the same plane. Alternatively, the first connection region CA1 and the second connection region CA2 may be disposed on different surfaces.

When the first connection region CA1 and the second connection region CA2 are disposed on the same plane, when connecting the first connection region CA1 and the second connection region CA2 to the printed circuit board or to the flexible printed circuit board, they may be connected on the same plane, and thus they may be easily connected.

A conductive material may be exposed on upper surfaces of the first connection region CA1 and the second connection region CA2, respectively, and the optical path control member may be electrically connected to the external printed circuit board or the flexible printed circuit board through the first connection region CA1 and the second connection region CA2.

For example, a pad portion may be disposed on the first connection region CA1 and the second connection region CA2, and a conductive adhesive including at least one of an anisotropic conductive film (ACF) and anisotropic conductive pastes (ACP) may be disposed between the pad portion and the printed circuit board or the flexible printed circuit board to connect the optical path control member.

Alternatively, the conductive adhesive including at least one of an anisotropic conductive film (ACF) and anisotropic conductive pastes (ACP) may be disposed between the first connection region CA1 and the second connection region CA2 and the printed circuit board or the flexible printed circuit board to direct connect the optical path control member without the pad portion.

The conductive material constituting the first connection region CA1 and the second connection region CA2 will be described in detail below.

The light conversion unit 300 may be disposed between the first substrate 110 and the second substrate 120. In detail, the light conversion unit 300 may be disposed between the first electrode 210 and the second electrode 220.

An adhesive layer or a buffer layer may be disposed between at least one of between the light conversion unit 300 and the first substrate 110 or between the light conversion unit 300 and the second substrate 120, and the first substrate 110, the second substrate 120, and the light conversion unit 300 may be adhered to each other by the adhesive layer and/or the buffer layer.

For example, an adhesive layer 410 may be disposed between the first electrode 210 and the light conversion unit 300, thereby adhering the first substrate 110 and the light conversion unit 300.

In addition, a buffer layer 420 may be disposed between the second electrode 220 and the light conversion unit 300, thereby improving adhesion between the second electrode 220 including different materials and the light conversion unit 300.

The above-described holes may be formed to pass through an entire or a portion of the buffer layer 420 and the light conversion unit 300. That is, the hole may pass through the second substrate 120, the second electrode 220, and the buffer layer 420 in the third direction and may pass through an entire or a portion of the light conversion unit 300.

The light conversion unit 300 may include a plurality of partition parts and accommodation parts. A light conversion material 330 including light conversion particles that move by application of a voltage and a dispersion liquid for dispersing the light conversion particles may be disposed in the accommodation part 320, and light transmission characteristics of the optical path control member may be changed by the light conversion particles.

In addition, the sealing part 500 for sealing the light conversion material 330 and the dam part 600 for easily injecting the light conversion material 330 may be disposed in the accommodation part 320.

Figure 4:
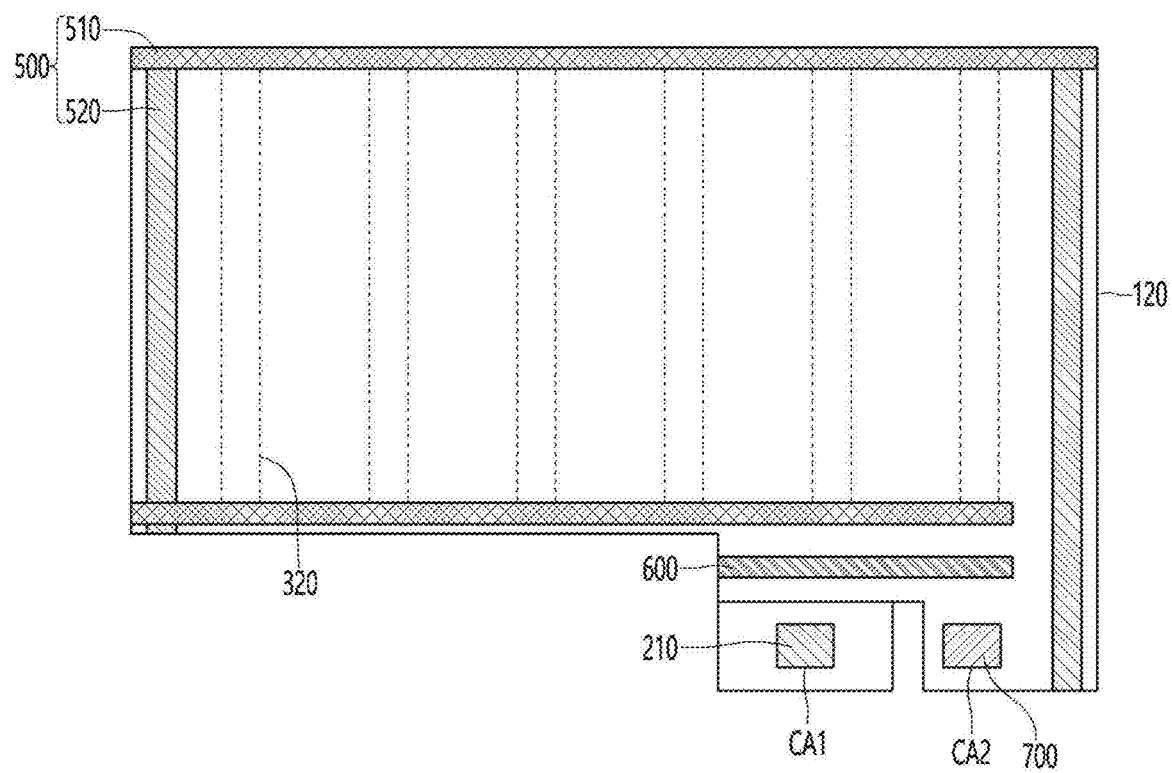
FIG. 4 is a top view of the second substrate in which the first and second substrates of the optical path control member are laminated according to the first embodiment.

Referring to FIGS. 3 and 4, the accommodation part 320 may be disposed to extend in one direction. In detail, the accommodation part 320 may extend in a direction corresponding to the second direction 2A of the first substrate 110 or the second substrate 120. That is, the accommodation part 320 may be disposed to extend in a direction corresponding to the width direction of the first substrate 110 or the second substrate 120.

Accordingly, both ends of the accommodation part 320 of the optical path control member according to the first embodiment may be disposed to face both ends of the first substrate 110 or the second substrate 120, respectively. That is, one end of the accommodation part 320 may be disposed to face one end of the first substrate 110 or the second substrate 120 in the second direction 2A. The other end of the accommodation part 320 may be disposed to face the other end of the first substrate 110 or the second substrate 120 in the second direction 2A.

Accordingly, both ends of the accommodation part 320 may be disposed in contact with the first sealing part 510 disposed to face in the second direction 2A and may be disposed to be spaced apart from the second sealing part 520.

Meanwhile, although not shown in the drawings, the accommodation part 320 may be disposed to extend up to the second protrusion, and the accommodation part 320 on the second protrusion may not include the light conversion material or may include less the light conversion material than other accommodation parts.

Figure 5:
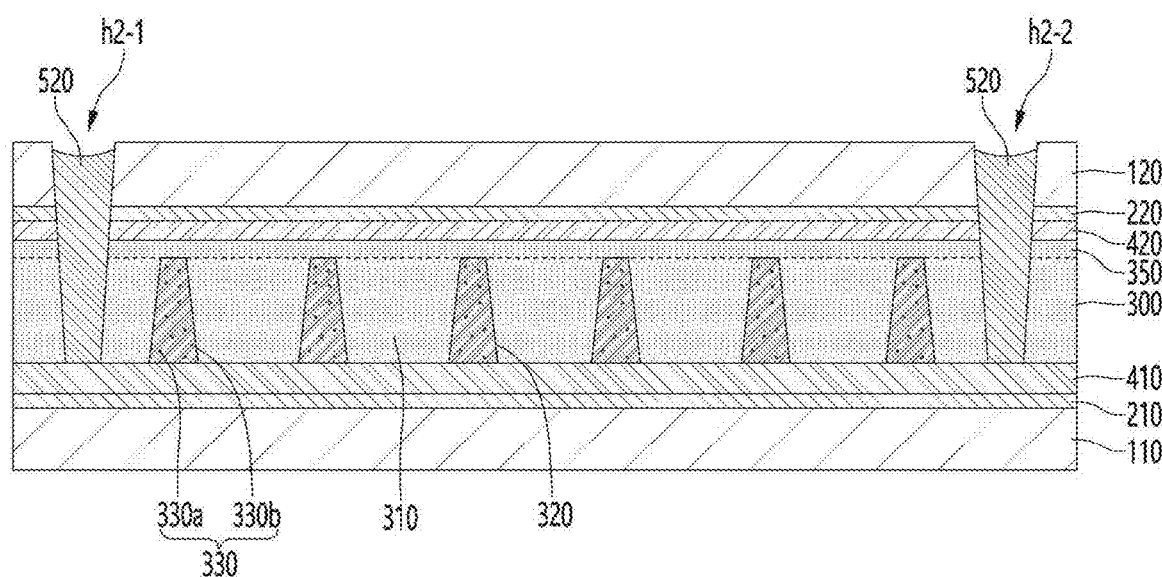
FIGS. 5 and 6 are cross-sectional views taken along line A-A' in FIG. 1.
Figure 6:
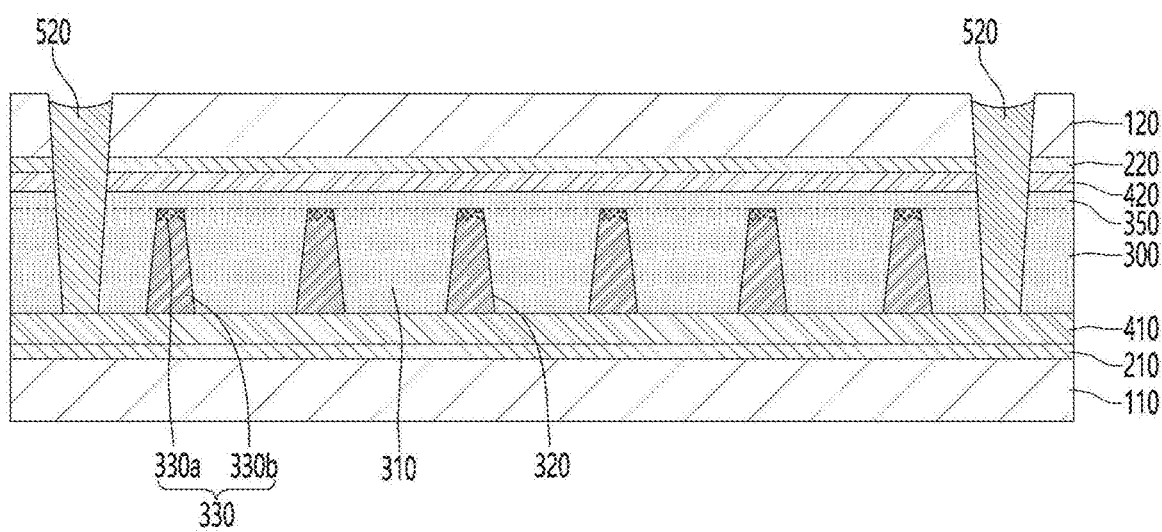

FIGS. 5 and 6 are cross-sectional views taken along line A-A' in FIG. 1.

Referring to FIGS. 5 and 6, the light conversion unit 300 may include the partition part 310 and the accommodation part 320.

The partition part 310 may be defined as a partition part dividing the accommodation part. That is, the partition part 310 may transmit light as a barrier region dividing a plurality of accommodation parts. That is, light emitted in the direction of the first substrate 110 or the second substrate 120 may pass through the partition part.

The partition part 310 and the accommodation part 320 may be disposed to extend in the second direction 2A of the first substrate 110 and the second substrate 120. That is, the partition part 310 and the accommodation part 320 may be disposed to extend in the width direction or the length direction of the first substrate 110 and the second substrate 120.

The partition part 310 and the accommodation part 320 may be disposed to have different widths. For example, a width of the partition part 310 may be greater than that of the accommodation part 320.

In addition, the accommodation part 320 may be formed in a shape extending from the first electrode 210 toward the second electrode 220 and narrowing in width.

The partition part 310 and the accommodation part 320 may be alternately disposed with each other. In detail, the partition part 310 and the accommodation part 320 may be alternately disposed with each other. That is, each of the partition parts 310 may be disposed between the accommodation parts 320 adjacent to each other, and each of the accommodation parts 320 may be disposed between the partition parts 310 adjacent to each other.

The partition part 310 may include a transparent material. The partition part 310 may include a material that may transmit light.

The partition part 310 may include a resin material. For example, the partition part 310 may include a photo-curable resin material. As an example, the partition part 310 may include a UV resin or a transparent photoresist resin. Alternatively, the partition part 310 may include urethane resin or acrylic resin.

The accommodation part 320 may be formed to partially penetrate the light conversion unit 300. Accordingly, the accommodation part 320 may be disposed in contact with the adhesive layer 410 and may be disposed to be spaced apart from the buffer layer 420. Accordingly, a base part 350 may be formed between the accommodation part 320 and the buffer layer 420.

A light conversion material 330 including light conversion particles 330a and a dispersion liquid 330b in which the light conversion particles 330a are dispersed may be disposed in the accommodation part 320.

The dispersion liquid 330b may be a material for dispersing the light conversion particles 330a. The dispersion liquid 330b may include a transparent material. The dispersion liquid 330b may include a non-polar solvent. In addition, the dispersion liquid 330b may include a material capable of transmitting light. For example, the dispersion liquid 330b may include at least one of a halocarbon-based oil, a paraffin-based oil, and isopropyl alcohol.

The light conversion particles 330a may be disposed to be dispersed in the dispersion liquid 330b. In detail, the plurality of light conversion particles 330a may be disposed to be spaced apart from each other in the dispersion liquid 330b.

The light conversion particles 330a may include a material capable of absorbing light. That is, the light conversion particles 330a may be light absorbing particles. The light conversion particles 330a may have a color. For example, the light conversion particles 330a may have a black-based color. As an example, the light conversion particles 330a may include carbon black.

The light conversion particles 330a may have a polarity by charging a surface thereof. For example, the surface of the light conversion particles 330a may be charged with a negative (−) charge. Accordingly, according to the application of the voltage, the light conversion particles 330a may move toward the first electrode 210 or the second electrode 220.

The light transmittance of the accommodation part 320 may be changed by the light conversion particles 330a. In detail, the accommodation part 320 may be converted into the light blocking part and the light transmitting part by changing the light transmittance due to the movement of the light conversion particles 330a. That is, the accommodation part 320 may change the transmittance of light passing through the accommodation part 320 by dispersion and aggregation of the light conversion particles 330a disposed inside the dispersion liquid 330b.

For example, the optical path control member according to the embodiment may be switched from a first mode to a second mode or from the second mode to the first mode by a voltage applied to the first electrode 210 and the second electrode 220.

In detail, in the optical path control member according to the first embodiment, the accommodation part 320 becomes the light blocking part in the first mode, and light of a specific angle may be blocked by the accommodation part 320. That is, a viewing angle of the user viewing from the outside is narrowed, so that the optical path control member may be driven in a privacy mode.

In addition, in the optical path control member according to the first embodiment, the accommodation part 320 becomes the light transmitting part in the second mode, and in the optical path control member according to the first embodiment, light may be transmitted through both the partition part 310 and the accommodation part 320. That is, the viewing angle of the user viewing from the outside may be widened, so that the optical path control member may be driven in a public mode.

Switching from the first mode to the second mode, that is, the conversion of the accommodation part 320 from the light blocking part to the light transmitting part may be realized by movement of the light conversion particles 330a of the accommodation part 320. That is, the light conversion particles 330a may have a charge on the surface thereof and may move toward the first electrode or the second electrode according to the application of a voltage according to characteristics of the charge. That is, the light conversion particles 330a may be electrophoretic particles.

For example, when a voltage is not applied to the optical path control member from the outside, the light conversion particles 330a of the accommodation part 320 are uniformly dispersed in the dispersion liquid 330b, and the accommodation part 320 may block light by the light conversion particles. Accordingly, in the first mode, the accommodation part 320 may be driven as the light blocking part.

In addition, when a voltage is applied to the optical path control member from the outside, the light conversion particles 330a may move. For example, the light conversion particles 330a may move toward one end or the other end of the accommodation part 320 by a voltage transmitted through the first electrode 210 and the second electrode 220. That is, the light conversion particles 330a may move from the accommodation part 320 toward the first electrode 210 or the second electrode 220.

For example, when a voltage is applied to the first electrode 210 and/or the second electrode 220, an electric field is formed between the first electrode 210 and the second electrode 220, and the light conversion particles 330a charged with the negative charge may move toward a positive electrode of the first electrode 210 and the second electrode 220 using the dispersion liquid 330b as a medium.

As an example, in the initial mode or when the voltage is not applied to the first electrode 210 and/or the second electrode 220, as shown in FIG. 5, the light conversion particles 330a may be uniformly dispersed in the dispersion liquid 330b, and the accommodation part 320 may be driven as the light blocking part.

Figure 8:
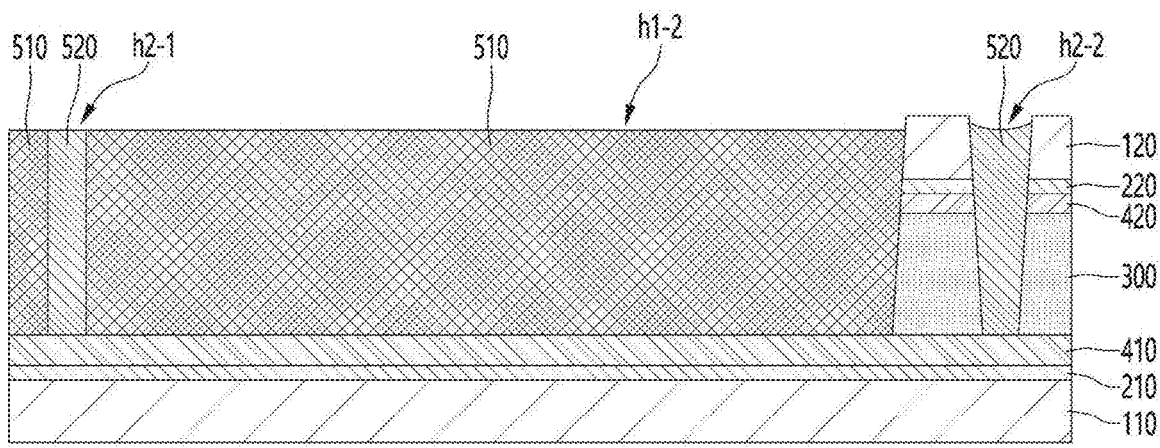
FIG. 8 is a cross-sectional view taken along line C-C' in FIG. 1.

In addition, when the voltage is applied to the first electrode 210 and/or the second electrode 220, as shown in FIG. 8, the light conversion particles 330a may move toward the second electrode 220 in the dispersion liquid 330b. That is, the light conversion particles 330a move in one direction, and the accommodation part 320 may be driven as the light transmitting part.

Accordingly, the optical path control member according to the embodiment may be driven in two modes according to a user's surrounding environment. That is, when the user requires light transmission only at a specific viewing angle, the accommodation part is driven as the light blocking part, or in an environment in which the user requires high brightness, a voltage may be applied to drive the accommodation part as the light transmitting part.

Therefore, since the optical path control member according to the embodiment may be implemented in two modes according to the user's requirement, the optical path control member may be applied regardless of the user's environment.

The second sealing part 520 may be disposed on the outermost side of the optical path control member. In detail, the second sealing part 520 extending in the second direction 2A and facing each other may be disposed on the outermost side of the optical path control member in the first direction 1A.

The second sealing part 520 may be disposed inside the holes described above. In detail, the second sealing part 520 may be disposed inside the third hole h2-1 and the fourth hole h2-2.

That is, the third hole h2-1 and the fourth hole h2-2 may be formed to sequentially pass through the second substrate 120, the second electrode 220, the buffer layer 420, and the light conversion unit 300 which is including the base part 350 and the partition part 310, and the second sealing part 520 may be formed by disposing the sealing material inside the third hole h2-1 and the fourth hole h2-2.

That is, one surface of the adhesive layer 410 may be exposed through the third hole h2-1 and the fourth hole h2-1, and the second sealing part 520 may be disposed in contact with the adhesive layer 410.

The second sealing part 520 may be disposed in contact with a side surface of the second substrate 120. In addition, the second sealing part 520 may be disposed in contact with a side surface of the second electrode 220. In addition, the second sealing part 520 may be disposed in contact with a side surface of the buffer layer 420. In addition, the second sealing part 520 may be disposed in contact with a side surface of the base part 350. In addition, the second sealing part 520 may be disposed in contact with a side surface of the partition part 310.

The second sealing part 520 may be disposed on a side surface of the optical path control member, that is, a side surface in the second direction 2A, to inhibit impurities that may penetrate from the outside from penetrating into the light conversion unit 300, that is, into the accommodation part 320 in which the light conversion material 330 is disposed.

The second sealing part 520 may be disposed to completely fill the third hole h2-1 and the fourth hole h2-2 or may be disposed to have a height lower than depths of the third hole h2-1 and the fourth hole h2-2. Accordingly, as shown in FIGS. 5 and 6, an upper surface of the second sealing part 520 may be disposed to have a height lower than an upper surface of the second substrate 120. That is, a step may be formed between the upper surface of the second sealing part 520 and the upper surface of the second substrate 120. In addition, the upper surface of the second sealing part 520 may be formed in a concave shape.

Meanwhile, in FIGS. 5 and 6, it is illustrated that the third hole h2-1 and the fourth hole h2-2 are formed up to a depth at which one surface of the adhesive layer 410 is exposed, but the embodiment is not limited thereto.

That is, the depths of the third hole h2-1 and the fourth hole h2-2 may vary through a process method, a process time, and the like for forming the third hole h2-1 and the fourth hole h2-2. h2-2.

For example, at least one of the third hole h2-1 and the fourth hole h2-2 may be formed up to a depth partially passing through the light conversion unit 300, and accordingly, one surface of the base part, the partition part 310 or the accommodation part 320 may be exposed by the third hole h2-1 and the fourth hole h2-2.

Accordingly, the second sealing part 520 may be disposed to be spaced apart from the adhesive layer 410.

Alternatively, at least one of the third hole h2-1 and the fourth hole h2-2 may be formed up to a depth partially passing through the adhesive layer 410, and accordingly, one surface of the adhesive layer 410 may be exposed by the third hole h2-1 and the fourth hole h2-2.

Alternatively, at least one of the third hole h2-1 and the fourth hole h2-2 may be formed up to a depth partially passing through the first electrode 210, and accordingly, one surface of the first electrode 210 may be exposed by the third hole h2-1 and the fourth hole h2-2.

Alternatively, at least one of the third hole h2-1 and the fourth hole h2-2 may be formed up to a depth partially passing through the first substrate 110, and accordingly, one surface of the first substrate 110 may be exposed by the third hole h2-1 and the fourth hole h2-2.

Figure 7:
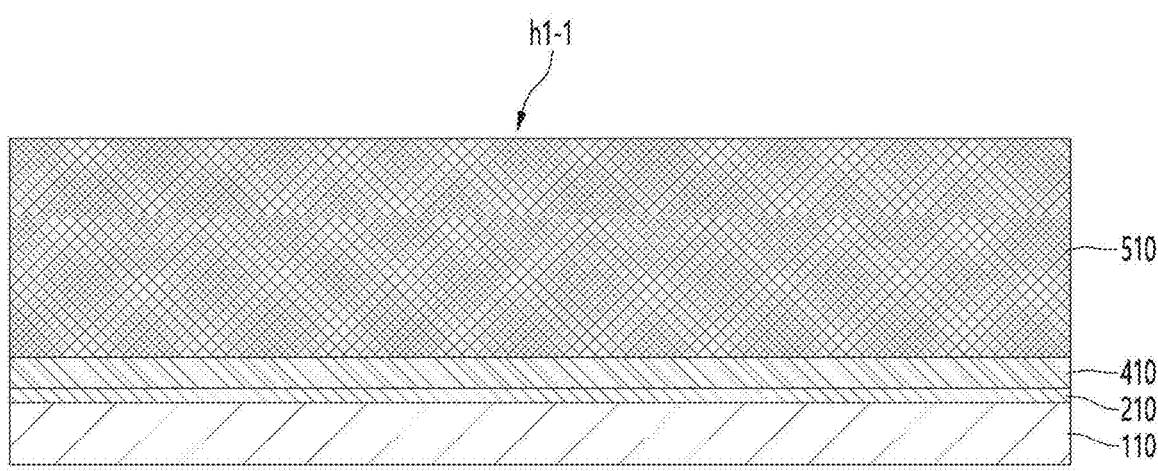
FIG. 7 is a cross-sectional view taken along line B-B' in FIG. 1.

FIG. 7 is a cross-sectional view taken along line B-B' in FIG. 1. That is, FIG. 7 is a cross-sectional view taken both ends of one of the first sealing parts 510.

Referring to FIG. 7, the first sealing part 510 may be disposed inside the first hole h1-1. The first sealing part 510 may be disposed in contact with a side surface of the second substrate 120. In addition, the first sealing part 510 may be disposed in contact with a side surface of the second electrode 220. In addition, the first sealing part 510 may be disposed in contact with a side surface of the buffer layer 420. In addition, the first sealing part 510 may be disposed in contact with a side surface of the base part 350. In addition, the first sealing part 510 may be disposed in contact with a side surface of the partition part 310.

For example, the first hole h1-1 may be formed to pass through all of the second substrate 120, the second electrode 220, the buffer layer 420, and the light conversion unit 300, and the first sealing part 510 may be disposed in contact with the side surface of the second substrate 120, the side surface of the second electrode 220, the side surface of the buffer layer 420, the side surface of the base part 350, and the side surface of the partition part 310. The first hole h1-1 may be disposed in contact with one end of the second substrate 120 in the first direction 1A and both ends of the second substrate 120 in the second direction 2A.

That is, the first hole h1-1 may be formed by removing one outer surface of the second substrate 120 in the first direction 1A and both outer surfaces of the second substrate 120 in the second direction 2A. Accordingly, in the one outer surface of the second substrate 120 in the first direction 1A, a portion of the first hole h1-1 may be the outermost surface of the second substrate 120, and in a portion where the first hole h1-1 1 among both outer surfaces of the second substrate 120 in the second direction 2A is formed, a portion of the first hole h1-1 may be the outermost surface of the second substrate 120.

The first hole h1-1 may be formed to sequentially pass through the second substrate 120, the second electrode 220, the buffer layer 420, and the light conversion unit 300 which is including the base part 350 and the partition part 310. Subsequently, the first sealing part 510 may be formed by disposing the sealing material inside the first hole h1-1.

The sealing material of the first sealing part 510 and the second sealing part 520 may include the same material. Alternatively, the sealing material of the first sealing part 510 and the second sealing part 520 may include different materials.

As an example, a sealing material of at least one of the first sealing part 510 and the second sealing part 520 may include a photocurable material. In addition, a sealing material of at least one of the first sealing part 510 and the second sealing part 520 may include a material having low reactivity with the light conversion material. For example, a sealing material of at least one of the first sealing part 510 and the second sealing part 520 may include polyurethane acrylate.

Since the first hole h1-1 is formed to sequentially pass through the second substrate 120, the second electrode 220, the buffer layer 420, and the light conversion unit 300 which is including the base part 350 and the partition part 310, one surface of the adhesive layer 410 may be exposed through the first hole h1-1.

Accordingly, the first sealing part 510 disposed inside the first hole h1-1 may be disposed in contact with the adhesive layer 410 inside the first hole h1-1.

The first sealing part 510 may be disposed on the side surface of the optical path control member, that is, a side surface in the first direction 1A, to seal the accommodation part 320 of the light conversion unit 300. That is, while inhibiting the light conversion material 330 accommodated in the accommodation part 320 from flowing out to the outside, impurities that may penetrate from the outside may be inhibited from penetrating into the light conversion unit 300.

The first sealing part 510 may be disposed to completely fill the first hole h1-1 or may be disposed to have a height lower than a depth of the first hole h1-1. Accordingly, an upper surface of the first sealing part 510 may be disposed to have a height lower than the upper surface of the second substrate 120. That is, a step may be formed between the upper surface of the first sealing part 510 and the upper surface of the first substrate 110. In addition, the upper surface of the first sealing part 510 may be formed in a concave shape.

FIG. 8 is a cross-sectional view taken along line C-C' in FIG. 1. That is, FIG. 8 is a cross-sectional view taken both ends of a sealing part to which the first sealing part 510 and the second sealing part 520 are connected in the first direction.

Referring to FIG. 8, the second hole h1-2 and the third hole h2-1 may be connected to each other.

In addition, the second hole h1-2 may be spaced apart from the fourth hole h2-2. That is, one end of the second hole h1-2 may be spaced apart from the fourth hole h2-2.

The second hole h1-2 and the fourth hole h2-2 may be spaced apart from each other, whereby an open region OA formed between the second hole h1-2 and the fourth hole h2-2 may be formed.

The electrode connection portion 700 of the second connection region CA2 disposed on the second protrusion PA2 of the second substrate 120 through the second electrode 220 disposed in the open region OA and the second electrode 220 may be connected without being disconnected. That is, a current and a voltage transmitted through the open region OA may be applied to the light conversion material 330 inside the accommodation part 320 disposed between the first sealing part 510 and the second sealing part.

Since the second hole h1-2 and the third hole h2-1 are connected to each other, the first sealing part 510 disposed on the second hole h1-2 and the second sealing part 520 disposed on the third hole h2-1 may be disposed to be connected to each other. In addition, since the second hole h1-2 and the fourth hole h2-2 are spaced apart from each other, the first sealing part disposed on the second hole h1-2. 510 may be disposed to be spaced apart from the second sealing part 520 disposed on the fourth hole h2-2.

Meanwhile, in the drawing, it is illustrated that the third hole h2-1 is disposed to be spaced apart from the end of the second substrate 120 in the first direction 1A, that is, the outer surface, but the embodiment is not limited thereto, and the third hole h2-1 may be formed by removing one outer surface of the second substrate 120 in the first direction 1A like the first hole h1-1 described above. Accordingly, in the one outer surface of the second substrate 120 in the first direction 1A, a portion of the third hole h2-1 may be the outermost surface of the second substrate 120.

Meanwhile, the third hole h2-1 and the fourth hole h2-2 may be disposed to have different lengths. In detail, a length of the fourth hole h2-2 in the second direction 2A may be greater than a length of the third hole h2-1 in the second direction 2A.

The fourth hole h2-2 may be disposed to extend to the second protrusion PA2 of the second substrate 120, and accordingly, the fourth hole h2-2 may be disposed. The length of may be disposed to be greater than that of the second-first hole h2-1.

Accordingly, a length of the second sealing part 520 disposed inside the third hole h2-1 and the fourth hole h2-2 may also vary. That is, a length of the second sealing part 520 disposed inside the fourth hole h2-2 may be greater than that of the second sealing part 520 disposed in the third hole h2-1.

A first sealing part and a second sealing part may be disposed inside the first hole, the second hole, the third hole, and the fourth hole, respectively.

The first sealing part and the second sealing part may be disposed to seal an inlet part and an outlet part of the accommodation part for accommodating the light conversion material and may be disposed to extend along a side surface region of the light conversion unit, that is, a side surface region in the first direction.

That is, the first sealing part may seal the first hole defined as the inlet part of the accommodation part and the second hole defined as the outlet part of the accommodation part, and the second sealing part may seal the side surface of the light conversion unit, that is, in a lateral direction of the optical path control member extending in a length direction of the accommodation part.

Accordingly, it is possible to inhibit the light conversion material inside the accommodation part from flowing out to the outside of the light conversion unit by the first sealing part, and it is possible to inhibit impurities from penetrating into the light conversion unit from the outside by the first sealing part and the second sealing part, thereby improving the reliability of the optical path control member.

In addition, since the first sealing part and the second sealing part are disposed inside the holes formed on the second substrate, as compared with the formation of the first sealing part and the second sealing part outside the light conversion unit, the size of the optical path control member may be reduced, and sealing characteristics of the optical path control member may be improved by inhibiting the sealing part material from being denatured by an external environment.

In addition, since the first sealing part and the second sealing part are formed to be buried in the second substrate, the first sealing part and the second sealing part may be fixed, so that it is possible to improve adhesive properties of the first sealing part and the second sealing part.

Figure 9:
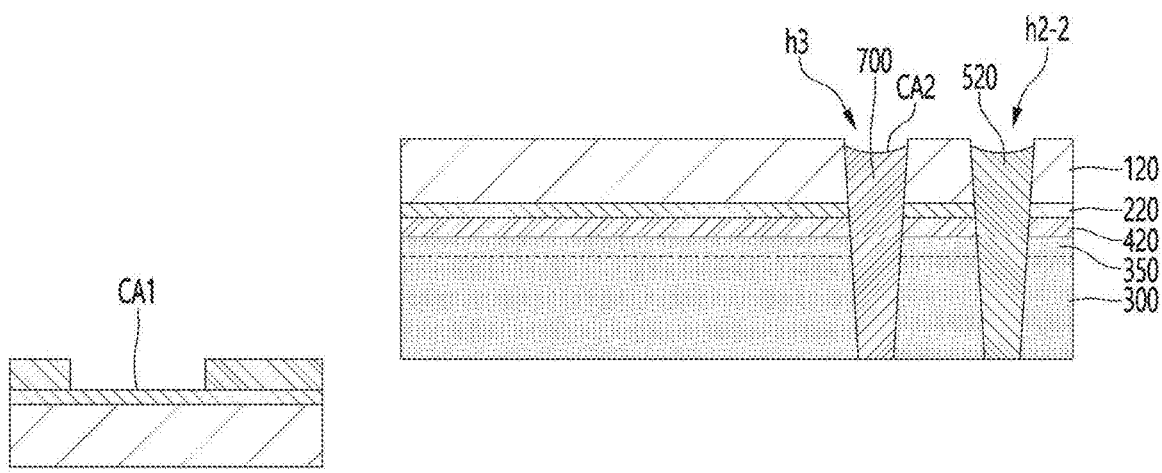
FIG. 9 is a cross-sectional view taken along line D-D' in FIG. 1.

FIG. 9 is a cross-sectional view taken along line D-D' in FIG. 1. That is, FIG. 9 is a cross-sectional view taken along a protrusion region of the first substrate and the second substrate.

Referring to FIG. 9, a first protrusion PA1 of the first substrate 110 and a second protrusion PA2 of the second substrate 120 may be disposed to be spaced apart from each other. That is, the first protrusion PA1 of the first substrate 110 and the second protrusion PA2 of the second substrate 120 may be disposed to be spaced apart from each other in the first direction 1A.

In addition, the first protrusion PA1 of the first substrate 110 and the second protrusion PA2 of the second substrate 120 may be disposed to be misaligned from each other in the first direction. That is, the first protrusion PA1 of the first substrate 110 and the second protrusion PA2 of the second substrate 120 may be disposed so as not to overlap each other in the third direction.

Accordingly, the adhesive layer 410, the first electrode 210, and the first substrate 110 may not be disposed under the second protrusion PA2 of the second substrate 120.

Accordingly, the first connection region CA1 disposed on the first protrusion PA1 and the second connection region CA2 disposed on the second protrusion PA2 are physically spaced apart from each other, so that it is possible to inhibit the first connection region CA1 and the second connection region CA2 from being electrically connected to each other by the first adhesive layer 410 having dielectric properties.

That is, by disposing the first connection region CA1 and the second connection region CA2 physically apart from each other, it is possible to inhibit the first connection region CA1 and the second connection region CA1 from being electrically connected to each other through.

The first connection region CA1 may be disposed on the first protrusion PAL The first electrode 210 may be exposed in the first connection region CA1. That is, the first electrode 210 on the first substrate 110 may be exposed by partially removing the adhesive layer 410 on the first protrusion PA1, and accordingly, an upper surface of the first electrode 210 may be exposed in the first connection region CA1. That is, the first electrode 210 exposed in the first connection region CA1 may be a first connection electrode that is connected to an external printed circuit board or a flexible printed circuit board.

In addition, the second connection region CA2 may be disposed on the second protrusion PA2. A third hole h3 may be formed in the second connection region CA2. An electrode connection portion 700 including a conductive material may be disposed inside the third hole h3.

The electrode connection portion 700 may include a material different from that of at least one of the first electrode 210 and the second electrode 220. In addition, a light transmittance of the electrode connection portion 700 may be smaller than that of at least one of the first electrode 210 and the second electrode 220.

For example, the electrode connection portion 700 may include a metal. In detail, the electrode connection portion 700 may include a metal paste in which metal particles are dispersed in a binder.

The electrode connection portion 700 may be disposed in contact with a side surface of the second substrate 120. In addition, the electrode connection portion 700 may be disposed in contact with a side surface of the second electrode 220. In addition, the electrode connection portion 700 may be disposed in contact with a side surface of the buffer layer 420. In addition, the electrode connection portion 700 may be disposed in contact with a side surface of the base part 350. In addition, the electrode connection portion 700 may be disposed in contact with a side surface of the partition part 310.

That is, the electrode connection portion 700 may be disposed in contact with at least one side surface of the second substrate 120, the second electrode 220, the buffer layer 420, the base part 350, and the partition part 310.

An upper surface of the electrode connection portion 700 may be disposed on the same plane as the upper surface of the second substrate 120 or may be lower. For example, the upper surface of the electrode connection portion 700 may be disposed on the same plane as the upper surface of the second substrate 120. Alternatively, the upper surface of the electrode connection portion 700 may be disposed lower than the upper surface of the second substrate 120.

Accordingly, the upper surface of the electrode connection portion 700 and the upper surface of the second substrate 120 may be formed on the same plane without a step, or may be disposed with a step such that the upper surface of the electrode connection portion 700 is lower.

Accordingly, it is possible to inhibit an overall thickness of the optical path control member from increasing due to a height of the electrode connection portion 700, thereby reducing the overall thickness of the optical path control member.

The electrode connection portion 700 may be electrically connected to the second electrode 220 and may be exposed to the outside of the second substrate 120. That is, the electrode connection portion 700 may be exposed on the second protrusion portion PA2 of the second substrate 120. That is, the upper surface of the electrode connection portion 700 may be exposed in the second connection region CA2.

Accordingly, the electrode connection portion 700 exposed in the second connection region CA2 may be a second connection electrode connected to an external printed circuit board or a flexible printed circuit board.

Accordingly, the first electrode 210 and the second electrode 220 may be respectively connected to the same printed circuit board or flexible printed circuit board through the first connection electrode of the first connection region and the second connection electrode of the second connection region to be electrically connected to each other.

In this case, since the electrode connection portion 700 is disposed to be buried in the third hole h3 and is exposed on the upper surface of the second substrate 120, the first connection electrode and the second connection electrode may be disposed on the same surface.

Accordingly, when connecting the first connection electrode and the second connection electrode to the same printed circuit board or flexible printed circuit board, they may be easily connected.

Alternatively, the first electrode 210 and the second electrode 220 may be respectively connected to another printed circuit board or a flexible printed circuit board through the first connection electrode of the first connection region and the second connection electrode of the second connection region to be electrically connected to each other. That is, the first connection electrode may be connected to a first circuit board, and the second connection electrode may be connected to a second circuit board different from the first circuit board.

In the optical path control member according to the first embodiment, the first connection electrode of the first connection region and the second connection electrode of the second connection region may be disposed on a first protrusion and a second protrusion formed on the first and second substrates.

The surfaces of the first and second substrates may not entirely protrude, and the first protrusion and the second protrusion may protrude only by an area in which the first connection region and the second connection electrode may be formed.

Accordingly, the areas of the first protrusion and the second protrusion may be reduced. Therefore, when the optical path control member is coupled to a display panel and applied to a display device, other components of the display device may be disposed in regions that do not correspond to the first protrusion and the second protrusion, thereby reducing a bezel region of the display device.

That is, the optical path control member according to the first embodiment reduces the size of the bezel region where the connection electrode is disposed, thereby reducing the bezel region of the display device to which the optical path control member is applied.

Figure 10:
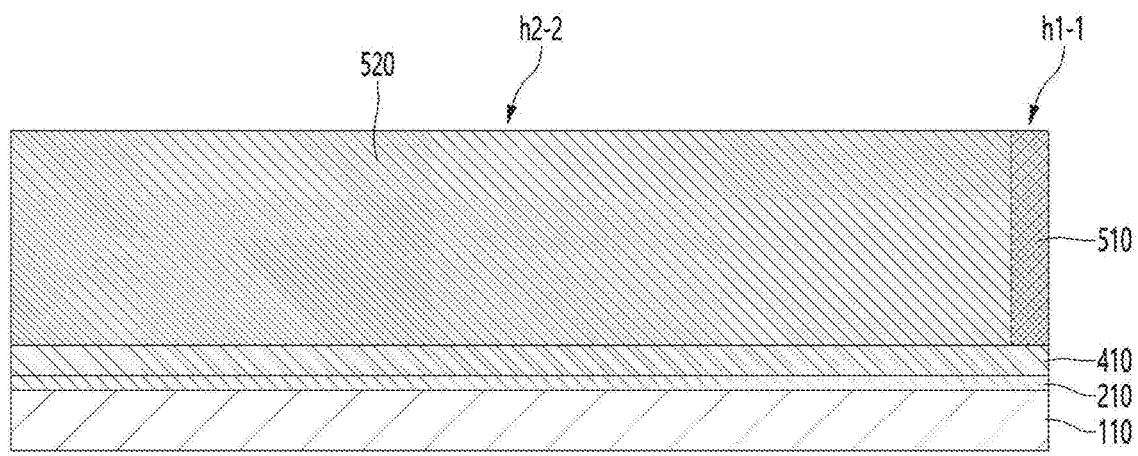
FIG. 10 is a cross-sectional view taken along line E-E' in FIG. 1.

FIG. 10 is a cross-sectional view taken along line E-E' in FIG. 1. That is, FIG. 10 is a cross-sectional view taken along both ends of the fourth hole in the second direction.

Referring to FIG. 10, the fourth hole h2-2 may be disposed to extend from the second protrusion PA2 of the second substrate 120 in the second direction 2A.

Referring to FIG. 10, the first hole h1-1 and the fourth hole h2-2 may be connected to each other.

Since the first hole h1-1 and the fourth hole h2-2 are connected, the first sealing part 510 disposed in the first hole h1-1 and the second sealing part 520 disposed on the fourth hole h2-2 may be disposed to be connected to each other.

Meanwhile, in the drawing, it is illustrated that the fourth hole h2-2 is disposed to be spaced apart from the end of the second substrate 120 in the first direction 1A, that is, the outer surface, but the embodiment is not limited thereto, and the fourth hole h2-2 may be formed by removing one outer surface of the second substrate 120 in the first direction 1A like the first hole h1-1 described above. Accordingly, in the one outer surface of the second substrate 120 in the first direction 1A, a portion of the fourth hole h2-2 may be the outermost surface of the second substrate 120.

Figure 11:
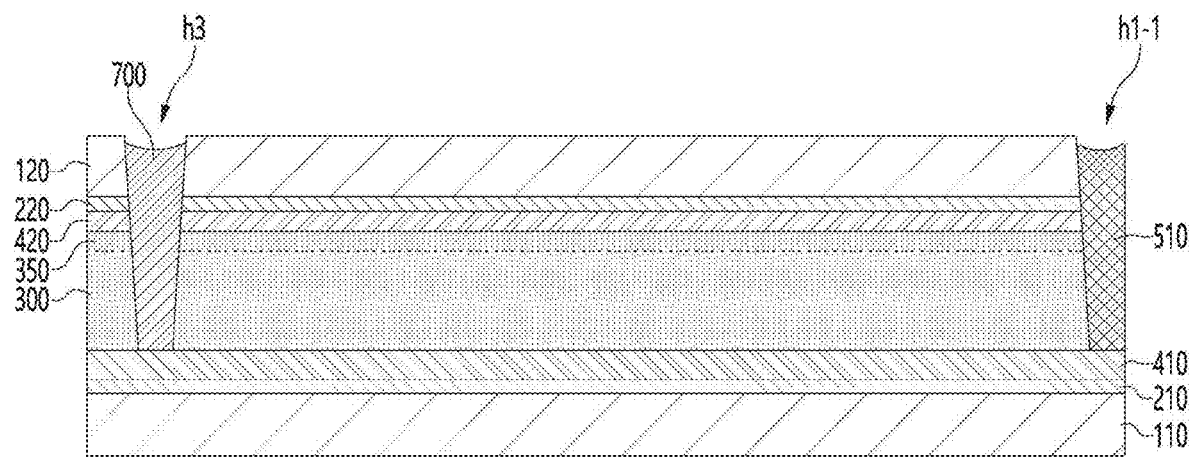
FIG. 11 is a cross-sectional view taken along line F-F' in FIG. 1.
Figure 12:
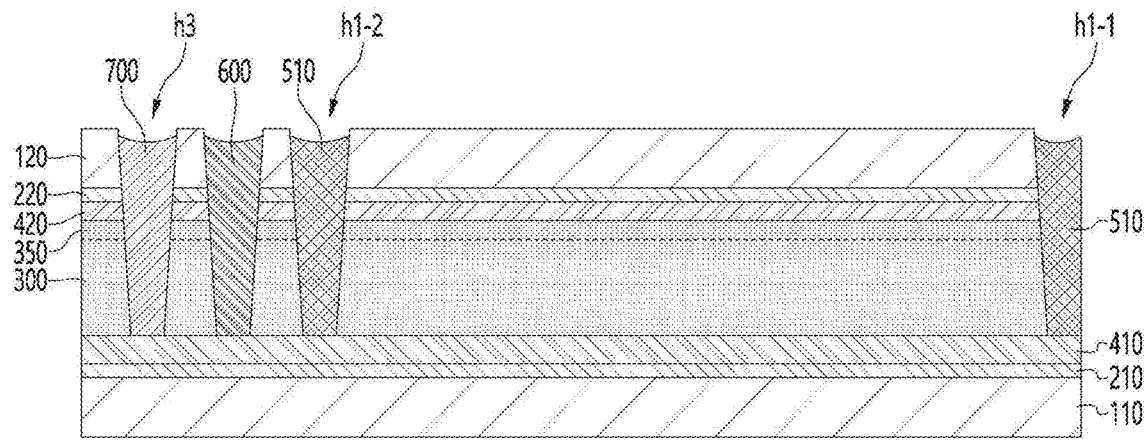
FIG. 12 is a cross-sectional view taken along line G-G' in FIG. 1.

FIG. 11 is a cross-sectional view taken along line F-F' in FIG. 1, and FIG. 12 is a cross-sectional view taken along line G-G' in FIG. 1, that is, FIGS. 11 and 12 are cross-sectional views taken the second connection region CA2 disposed on the second protrusion PA2 in the second direction.

Referring to FIGS. 11 and 12, the second connection region CA2 may include a region overlapping the first sealing part 510 and a region not overlapping the first sealing part 510.

That is, since the second hole h1-2 and the fourth hole h2-2 are disposed to be spaced apart from each other, the second connection region CA2 may be disposed in a region overlapping the open region OA in the second direction and in a region overlapping the first sealing part 510 disposed inside the second hole h1-2.

In addition, referring to FIG. 12, a dam part 600 may be disposed between the second connection region CA2, that is, between the electrode connection portion 700 and the first sealing part 510. That is, the dam part 600 may be disposed on the second protrusion PA2 between the electrode connection portion 700 and the first sealing part 510.

The dam part 600 may be formed by filling a dam forming material in a hole passing through the second substrate 120, the second electrode 220, the buffer layer 410, and the light conversion unit 300.

The dam part 600 is a material that controls an injection length of the light conversion material when the light conversion material 330 is injected into the accommodation part 320, and the dam part 600 may inhibit the light conversion material 330 from overflowing in an outer direction of the dam, that is, in a direction of the electrode connection portion 700.

Meanwhile, the dam part 600 may be disposed in both regions adjacent to the first hole h1-1 defined as the inlet part of the accommodation part and the second hole h1-2 defined as the outlet part, and a part of the dam part 600 may be removed during the manufacturing process.

That is, a part of the dam part 600 may be removed during the manufacturing process of the optical path control member, a part of the dam part 600 may remain, and a part of the dam part may remain in a region adjacent to the second connection region CA2.

Meanwhile, the light conversion unit 300 may remain between the electrode connection portion 700 and the dam part 600. Alternatively, when the light conversion unit 300 between the electrode connection portion 700 and the dam part 600 is a partition part 310 region, as shown in FIG. 12, the light conversion unit 300, the buffer layer 420, the second electrode 220, and the second substrate 120 may remain between the electrode connection portion 700 and the dam part 600.

However, when the light conversion unit 300 between the electrode connection portion 700 and the dam part 600 is the accommodation part 320 region, a material of the dam part 600 may move into the accommodation part 320, so that the dam part 600 and the electrode connection portion 700 may contact each other.

In addition, the light conversion unit 300 may remain between the dam part 600 and the first sealing part 510. Alternatively, when the light conversion unit 300 between the dam part 600 and the first sealing part 510 is the partition part 310 region, as shown in FIG. 12, the light conversion unit 300, the buffer layer 420, the second electrode 220, and the second substrate 120 may remain between the dam part 600 and the first sealing part 510.

However, when the light conversion unit 300 between the electrode connection portion 700 and the dam part 600 is the accommodation part 320 region, a material of the dam part 600 may move into the accommodation part 320, so that the first sealing part 510 and the dam part 600 may contact each other.

Figure 13:
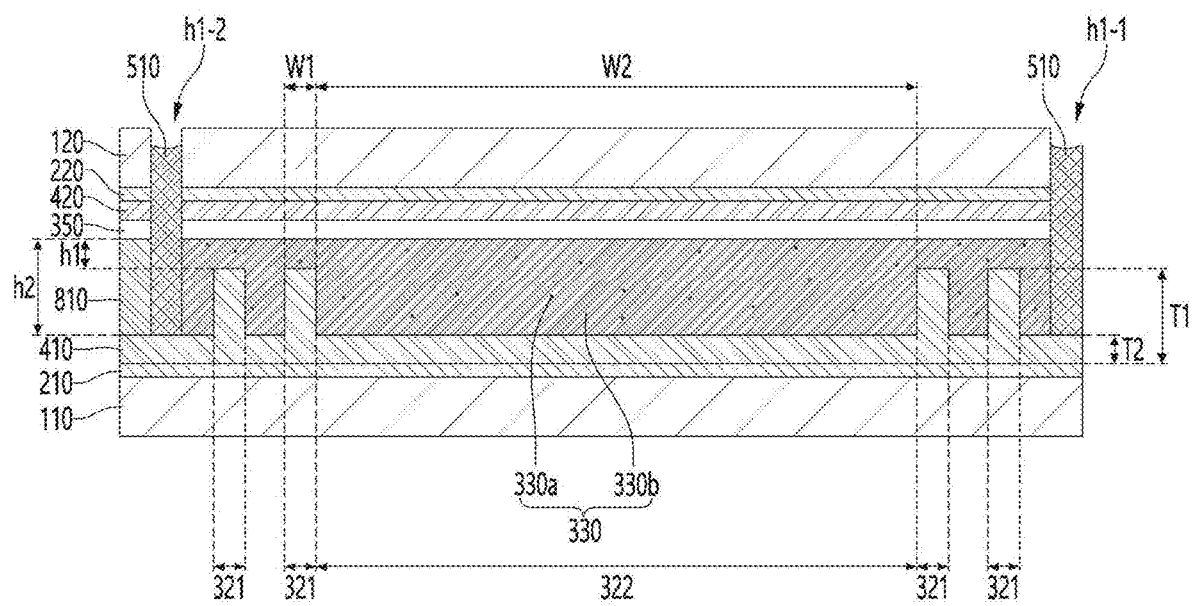
FIGS. 13 and 14 are cross-sectional views taken along line H-H' in FIG. 1.
Figure 14:
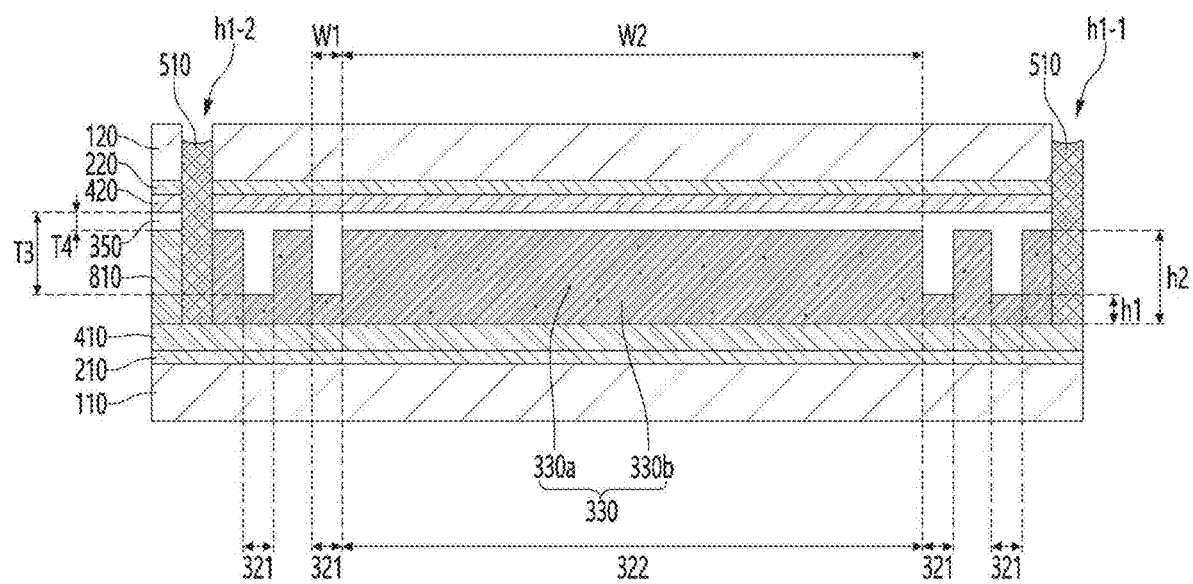

FIGS. 13 and 14 are cross-sectional views taken along line H-H' in FIG. 1. That is, FIGS. 13 and 14 are cross-sectional views taken one accommodation part of the optical path control member in the second direction.

Referring to FIGS. 13 and 14, a light conversion material 330 may be disposed inside the accommodation part 320. In detail, the light conversion material 330 and the first sealing part 510 may be disposed inside the accommodation part 320.

The first sealing part 510 may be disposed at one end and the other end of the accommodation part 320 in the second direction 2A to seal the light conversion material 330 disposed inside the accommodation part 320.

That is, the first sealing part 510 may seal the inlet part and the outlet part of the accommodation part.

The light conversion material 330 inside the accommodation part 320 may be sealed by the first sealing part 510, so that it is possible to inhibit the light conversion material 330 from flowing out to the outside of the optical path control member.

The first sealing part 510 disposed in the first hole h1-1 may be disposed in contact with the light conversion material 330. In addition, the first sealing part 510 disposed in the second hole h1-2 may be in contact with the light conversion material 300 and a first mixed region 810.

The first mixing region 810 may be a region where both the material of the dam part 600 and a material of the first sealing part 510, which are removed during the manufacturing process of the optical path control member, are disposed.

That is, the first mixing region 810 may include the same or a different material from the first sealing part 510.

For example, when the materials of the first sealing part 510 and the dam part 600 include the same material, the first mixing region 810 may be a region where the first sealing part 510 extends.

Alternatively, when the materials of the first sealing part 510 and the dam part 600 include different materials, the first mixing region 810 may be a region where the materials of the first sealing part 510 and the dam part 600 are mixed or a region where the materials of the first sealing part 510 and the dam part 600 are separated while having an interface without being mixed with each other and disposed together.

By the first mixing region 810 disposed inside the accommodation part 320, it is possible to minimize the occurrence of air bubbles in the accommodation part 320.

That is, as an injection amount of the material of the dam part 600 varies in any one of the accommodation parts, a size of a space region between the first sealing part 510 and the dam part 600 may vary, and by disposing the sealing material of the first sealing part 510 inside such a space region in an appropriate amount, the inside of the accommodation part may be disposed to fill with the first sealing part 510, the light conversion material 330, and the like.

Accordingly, it is possible to inhibit the occurrence of air bubbles due to voids or the like inside the accommodation part 320 and a light leakage phenomenon or the like according thereto.

Meanwhile, Referring to FIGS. 13 and 14, the light conversion material 330 accommodated in the accommodation part 320 may include regions disposed at different heights.

In detail, the accommodation part 320 may include a first region 321 and a second region 322 according to the height of the light conversion material 330 disposed inside the accommodation part 320.

In detail, the first region 321 may be defined as a region adjacent to the first sealing part 510. In addition, the second region 322 may be defined as a region farther from the first sealing part 510 than the first region 321.

That is, the accommodation part 320 may include the second region 322 and the first region 321 between the second region 322 and the first sealing part 510.

At least one first region 321 may be disposed inside each of the accommodation parts. For example, only one first region 321 adjacent to one of the first sealing parts may be disposed inside each of the accommodation parts. Alternatively, a plurality of first regions 321 adjacent to one of the first sealing parts may be disposed inside each of the accommodation parts. Alternatively, two first regions 321 adjacent to the first sealing parts may be included in each of the accommodation parts. Alternatively, a plurality of first regions 321 adjacent to the first sealing parts may be included in each of the accommodation parts.

The height of the light conversion material disposed in the first region 321 and the second region 322 may be different from each other. In detail, a first height h1 of the light conversion material disposed in the first region 321 may be smaller than a second height h2 of the light conversion material disposed in the second region 322.

That is, the height of the light conversion material in the first region 321 adjacent to the first sealing part 510 may be smaller than the height of the light conversion material in the second region 322 in the accommodation part 320.

Accordingly, it is possible to inhibit the light conversion material disposed inside the accommodation part 320 from leaking to the outside. In detail, when the optical path control member is used for a monitor or a laptop computer, the optical path control member may be erected at an inclination angle of a right angle, an obtuse angle, or an acute angle depending on a position of a screen of the monitor or the laptop computer used therein.

Accordingly, the accommodation part of the optical path control member is also erected at an inclination angle of a right angle, an obtuse angle, or an acute angle, and accordingly, the light conversion material inside the accommodation part may leak in a direction of gravity from a direction of the first hole or the second hole of the optical path control member.

However, in the optical path control member according to the embodiment, by making the height of the light conversion material adjacent to the first sealing part disposed in the first hole or the second hole in the accommodation part lower than that of other regions, it is possible to minimize the leakage of the light conversion material in the direction of gravity when the optical path control member is used.

The first height h1 of the light conversion material disposed in the first region 321 may be less than or equal to the second height h2 of the light conversion material disposed in the second region 322. In detail, the first height h1 of the light conversion material disposed in the first region 321 may have a height of 99.9% or less of the second height h2 of the light conversion material disposed in the second region 322. In more detail, the first height h1 of the light conversion material disposed in the first region 321 may have a height of 99.5% or less of the second height h2 of the light conversion material disposed in the second region 322. In more detail, the first height h1 of the light conversion material disposed in the first region 321 may have a height of 99% or less of the second height h2 of the light conversion material disposed in the second region 322. In more detail, the first height h1 of the light conversion material disposed in the first region 321 may have a height of 97% or less of the second height h2 of the light conversion material disposed in the second region 322. In more detail, the first height h1 of the light conversion material disposed in the first region 321 may have a height of 95% or less of the second height h2 of the light conversion material disposed in the second region 322. In more detail, the first height h1 of the light conversion material disposed in the first region 321 may have a height of 90% or less of the second height h2 of the light conversion material disposed in the second region 322.

In more detail, the first height h1 of the light conversion material disposed in the first region 321 may have a height of 10% to 99.9%, 50% to 99.8%, 70% to 99.7%, 80% to 99.6%, 90% to 99.5%, 90% to 99.0%, or 90% to 95% of the second height h2 of the light conversion material disposed in the second region 322.

When the first height h1 is formed in a height exceeding 99.9% of the second height h2, when the optical path control member is used, the light conversion material may leak in the direction of gravity from the direction of the first hole or the second hole. In addition, when the first height h1 is formed in a height of less than 10% of the second height h2, a height difference between the second region and the light conversion material of the second region may be visually recognized from the outside, and thus visibility may be deteriorated.

Sizes of the first region 321 and the second region 322 may be different from each other. In detail, a first width w1 of the first region 321 may be smaller than a second width w2 of the second region 322 based on the length direction of the accommodation part 320.

In detail, the first width w1 of the first region 321 may have a size within 20%, within 15%, within 10%, or within 5% of a total width of the accommodation part 320 in which the light conversion material 330 is disposed. In detail, the first width w1 of the first region 321 may have a size of 0.1% to 20%, 1.5% to 15%, or 0.7% to 10% of the total width of the accommodation part 320 in which the light conversion material 330 is disposed.

As an example, the first width w1 of the first region 321 may be 20 mm or less, 15 mm or less, 10 mm or less, or 5 mm or less. In detail, the first width w1 of the first region 321 may be 0.001 mm to 20 mm, 0.01 mm to 15 mm, 0.1 mm to 10 mm, or 1 mm to 5 mm.

When the first width w1 is formed in a width exceeding 20% of the total width of the accommodation part 320, an amount of the light conversion material is not sufficiently injected into the accommodation part 320, and thus the light conversion characteristics of the optical path control member may be deteriorated. In addition, when the first width w1 is formed to be less than 0.1% of the total width of the accommodation part 320, the light conversion material may leak in the direction of gravity from the direction of the first hole or the second hole when the optical path control member is used.

Meanwhile, in order to differentiate the heights of the light conversion material in the first region 321 and the second region 322, a thickness of the adhesive layer 410 or a thickness of the base part 350 may be different from each other in the first region 321 and the second region 322.

For example, referring to FIG. 13, adhesive layers having different thicknesses may be disposed on the first region 321 and the second region 322. In detail, the adhesive layer thickness T1 of the first region 321 may be greater than the adhesive layer thickness T2 of the second region 322.

Accordingly, in the accommodation part 320, the height at which the light conversion material may be disposed in the first region 321 is reduced compared to that of the second region 322 due to a difference in thickness of the adhesive layers depending on the region, and accordingly, the height of the light conversion material in the first region 321 may be smaller than that of the second region 322.

Alternatively, base parts having different thicknesses may be disposed in the first region 321 and the second region 322. In detail, a thickness T3 of a base part of the first region 321 may be greater than a thickness T4 of a base part of the second region 322.

Accordingly, in the accommodation part 320, the height at which the light conversion material may be disposed in the first region 321 is reduced compared to that of the second region 322 due to the difference in thickness of the adhesive layers depending on the region, and accordingly, the height of the light conversion material in the first region 321 may be smaller than that of the second region 322.

The optical path control member according to the first embodiment may include regions where the heights of the light conversion materials in each of the accommodation parts are different from each other. That is, the height of the light conversion material in a region adjacent to the first sealing part may be formed to be smaller than the height of the light conversion material in the other region.

Accordingly, when the optical path control member is used, it is possible to minimize the leakage of the light conversion material disposed in the accommodation part in the direction of gravity. That is, by making the amount of the light conversion material in the region adjacent to an end region of the accommodation part smaller than in other regions, it is possible to minimize the leakage of the light conversion material disposed in the accommodation part.

Figure 15:
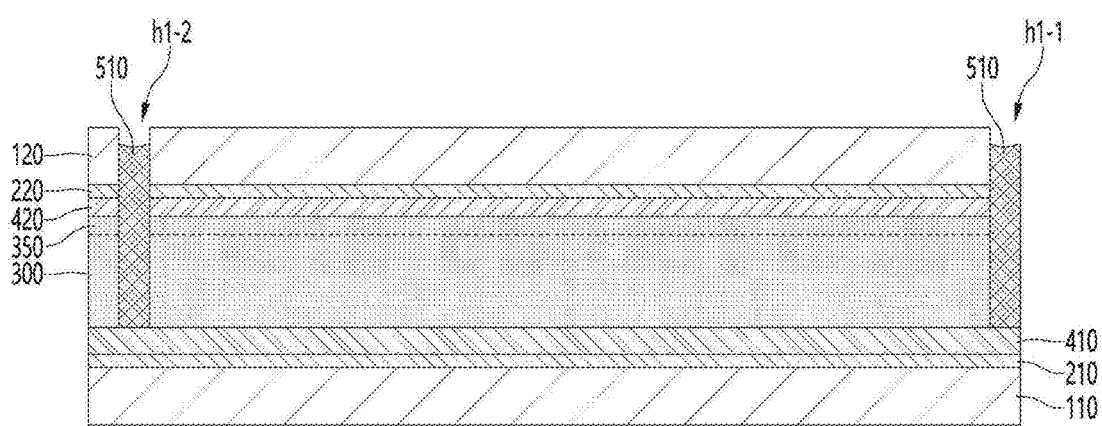
FIG. 15 is a cross-sectional view taken along line I-I' in FIG. 1.

FIG. 15 is a cross-sectional view taken along line I-I' in FIG. 1. That is, FIG. 15 is a cross-sectional view taken one partition part of the optical path control member in the second direction.

Referring to FIG. 15, the partition part 310 may be disposed in a region corresponding to the partition part 310, and the partition part 310 may be entirely removed from the second substrate 120 to form the first sealing part 510.

That is, the first sealing part 510 may be disposed even in a region where the partition part is disposed. Accordingly, an area of the first sealing part 510 may be increased by a size in which the partition part is removed.

Therefore, an arrangement area of the first sealing part 510 may be increased without increasing a thickness of the first sealing part 510.

Accordingly, sealing characteristics of the light conversion material according to the first sealing part 510 may be improved.

In the optical path control member according to the first embodiment, a first hole, a second hole, a third hole, and a fourth hole that pass through the second substrate, the second electrode, the buffer layer, and an entire or a portion of the light conversion unit on the second substrate may be formed.

In addition, a first sealing part and a second sealing part may be disposed inside the first hole, the second hole, the third hole, and the fourth hole, respectively.

The first sealing part and the second sealing part may be disposed to seal the inlet part and the outlet part of the accommodation part for accommodating the light conversion material and may be disposed to extend along a side region of the light conversion unit, that is, a side region in the first direction.

Accordingly, it is possible to inhibit the light conversion material inside the accommodation part from flowing out to the outside of the light conversion unit by the first sealing part, and it is possible to inhibit impurities from penetrating into the light conversion unit from the outside by the first sealing part and the second sealing part, thereby improving the reliability of the optical path control member.

In addition, since the first sealing part and the second sealing part are disposed inside the holes formed on the second substrate, as compared with the formation of the first sealing part and the second sealing part outside the light conversion unit, the size of the optical path control member may be reduced, and sealing characteristics of the optical path control member may be improved by inhibiting the sealing part material from being denatured by an external environment.

In addition, in the optical path control member according to the first embodiment, the first connection electrode and the second connection electrode may be disposed on a first protrusion and a second protrusion formed on the first substrate and the second substrate.

The surfaces of the first and second substrates may not entirely protrude, and the first protrusion and the second protrusion may protrude only by an area in which the first connection region and the second connection electrode may be formed.

Accordingly, the areas of the first protrusion and the second protrusion may be reduced. Therefore, when the optical path control member is coupled to a display panel and applied to a display device, other components of the display device may be disposed in regions that do not correspond to the first protrusion and the second protrusion, thereby reducing a bezel region of the display device.

That is, the optical path control member according to the first embodiment reduces the size of the bezel region where the connection electrode is disposed, thereby reducing the bezel region of the display device to which the optical path control member is applied.

In addition, the optical path control member according to the first embodiment may include regions where the heights of the light conversion materials in each of the accommodation parts are different from each other. That is, the height of the light conversion material in a region adjacent to the first sealing part may be formed to be smaller than the height of the light conversion material in the other region.

Accordingly, when the optical path control member is used, it is possible to minimize the leakage of the light conversion material disposed in the accommodation part in the direction of gravity. That is, by making the amount of the light conversion material in the region adjacent to an end region of the accommodation part smaller than in other regions, it is possible to minimize the leakage of the light conversion material disposed in the accommodation part.

Hereinafter, an optical path control member according to a second embodiment will be described with reference to FIGS. 16 to 21.

In the description of the optical path control member according to the second embodiment, descriptions of the same as or similar to those of the optical path control member according to the first embodiment described above will be omitted, and the same reference numerals will be assigned to the same components.

Referring to FIGS. 16 to 21, in the optical path control member according to the second embodiment, an accommodation part 320 of the light conversion unit is tilted at a predetermined angle to be disposed unlike the first embodiment described above.

Referring to FIGS. 16 to 19, the accommodation part 320 may extend in a direction different from the first direction 1A and the second direction 2A.

Accordingly, one end and the other end of the at least one accommodation part among the accommodation parts 320 may be in contact with the first sealing part 510, and one end and the other end of the at least one accommodation part may be in contact with the first sealing part 510 and the second sealing part 520.

As the accommodation part is tilted at a predetermined inclination angle, and when the optical path control member is coupled to a display panel to form a display device, it is possible to inhibit a moire phenomenon caused by overlapping the accommodation part of the optical path control member and a pattern of the display panel.

That is, the one end and the other end of the accommodation part 320 according to the second embodiment may be formed on both an outer surface in the first direction and an outer surface in the second direction of the optical path control member.

Figure 16:
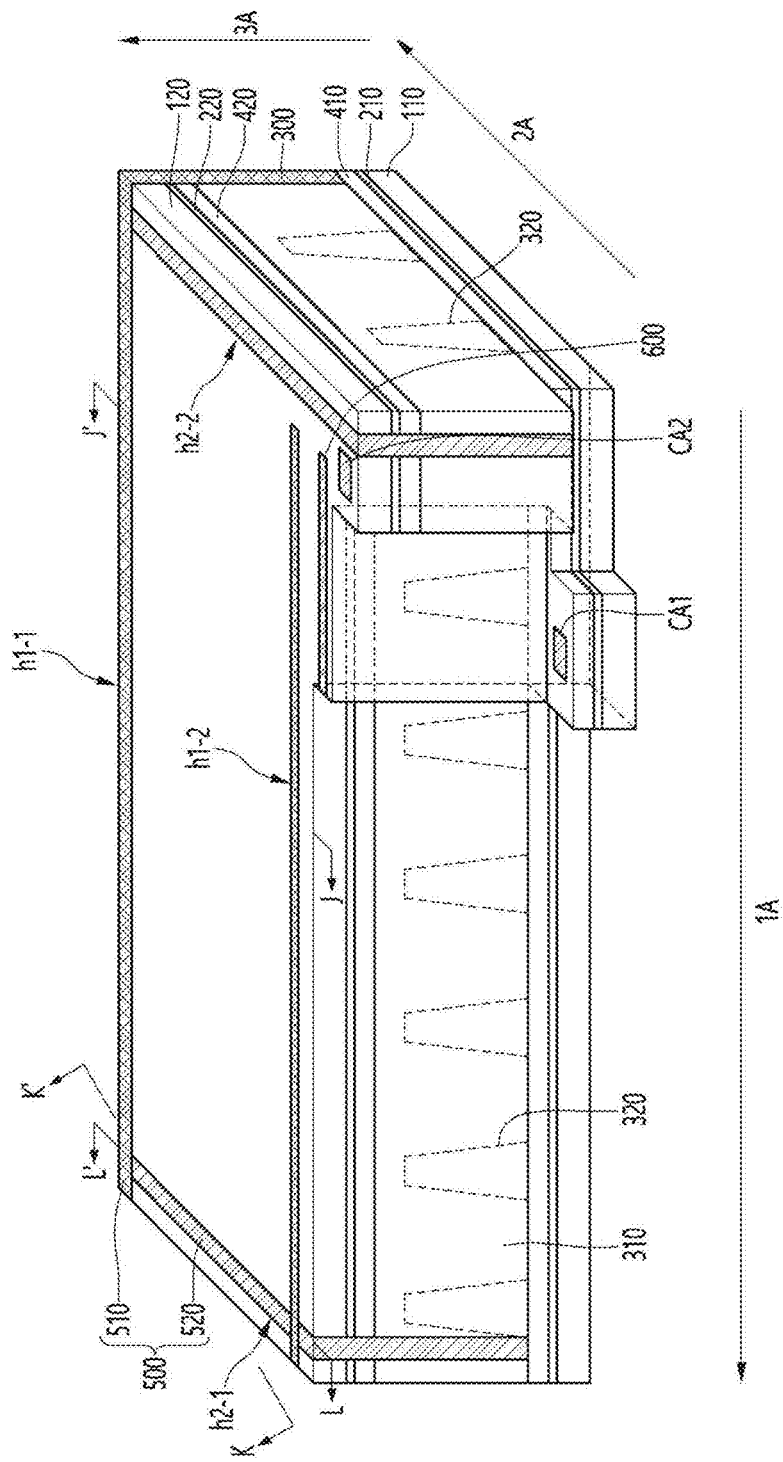
FIG. 16 is a perspective view of an an optical path control member according to a second embodiment.
Figure 17:
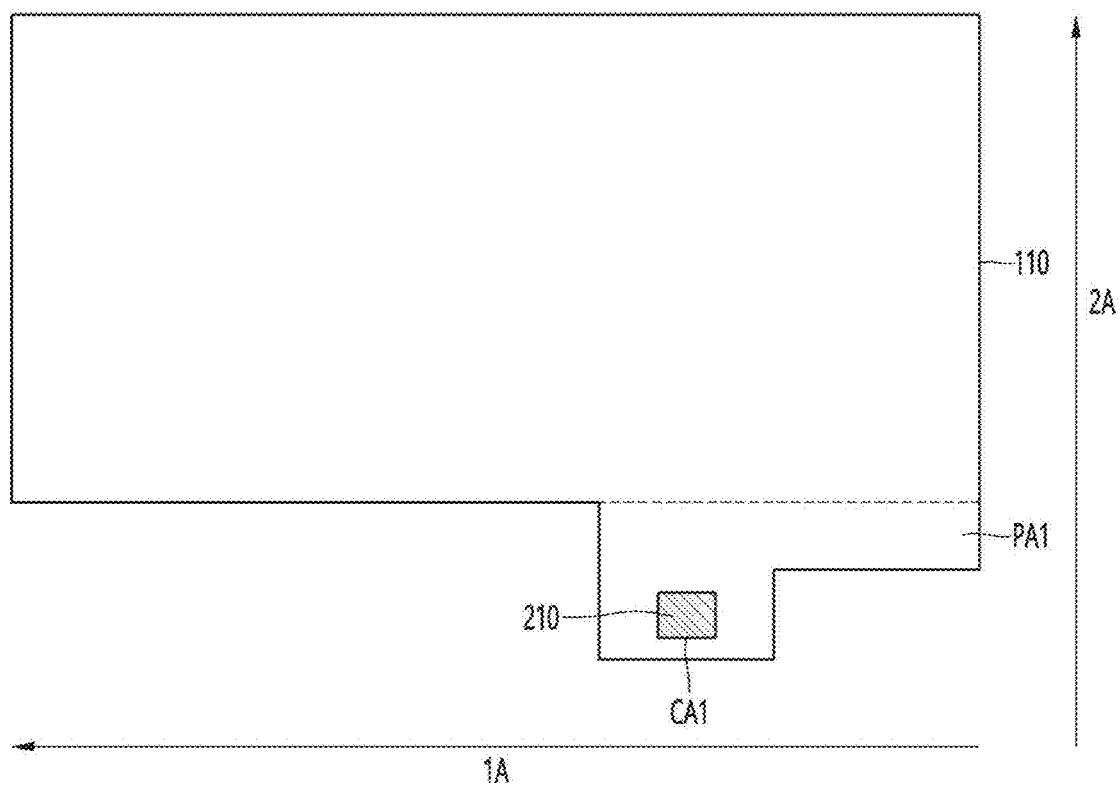
FIG. 17 is a top view of a first substrate of an optical path control member according to a second embodiment.
Figure 19:
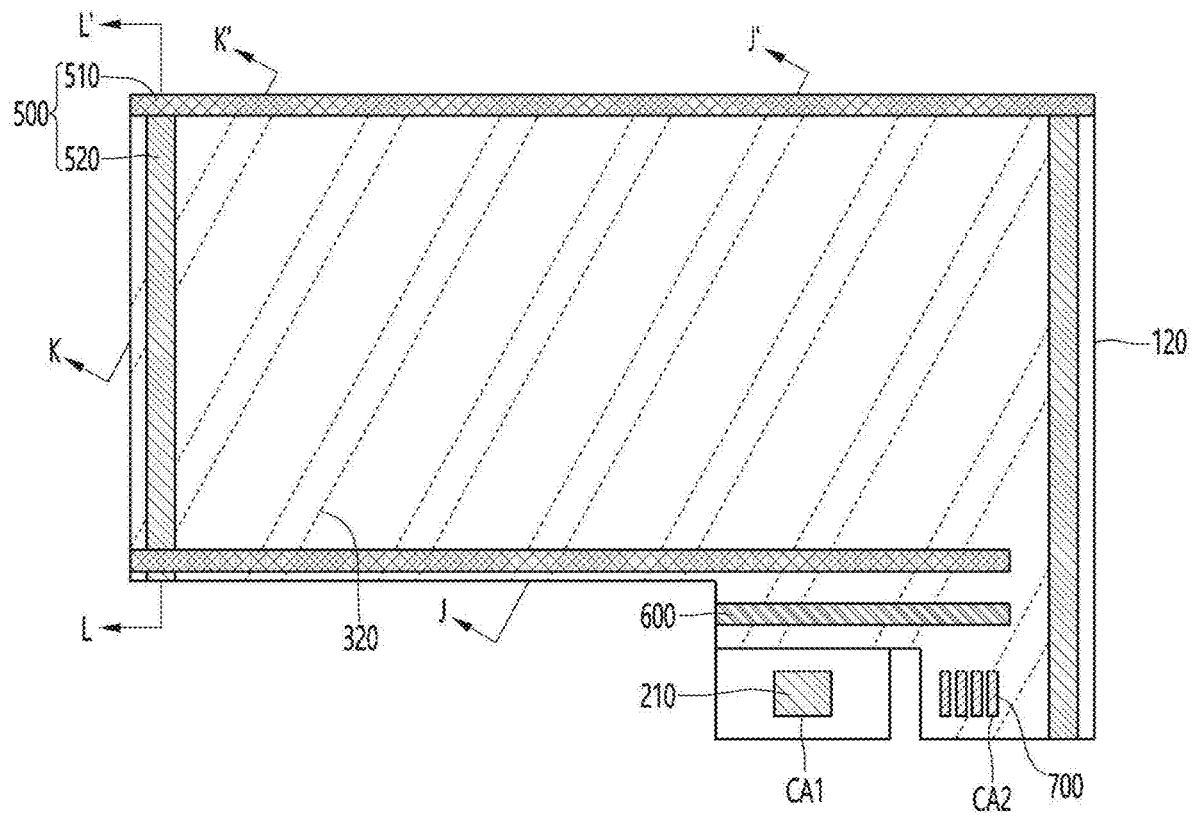
FIG. 19 is a top view of the second substrate in which the first and second substrates of the optical path control member are laminated according to the second embodiment.
Figure 20:
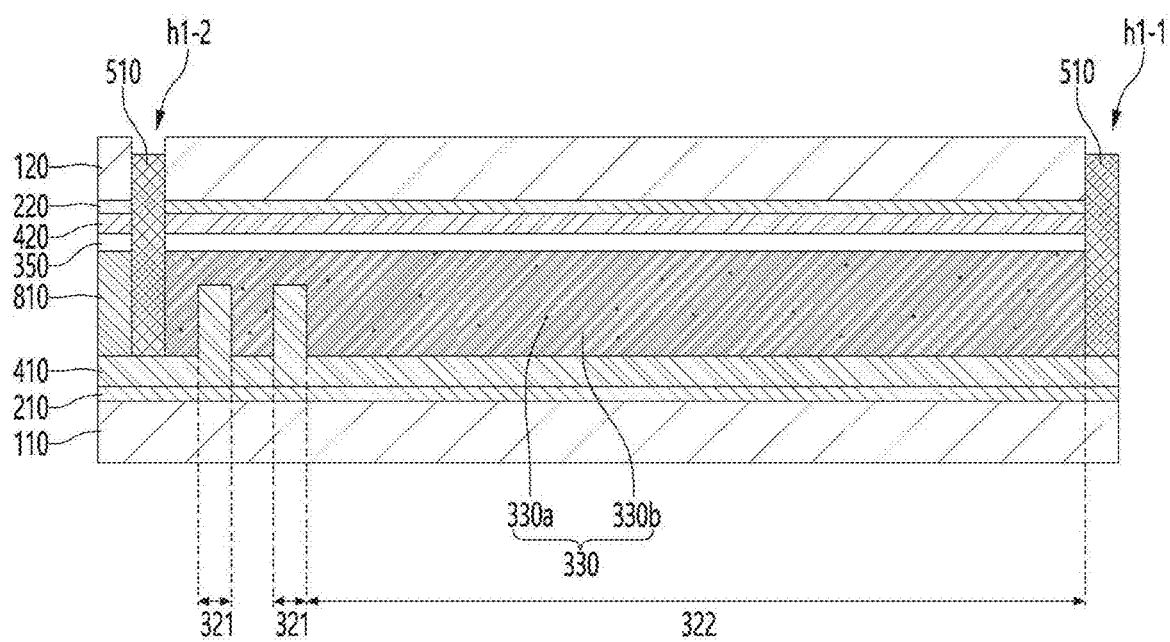
FIG. 20 is a cross-sectional view taken along line J-J' in FIG. 18.

FIG. 20 is a cross-sectional view taken along line J-J' in FIGS. 16 and 19. That is, FIG. 19 is a cross-sectional view taken one accommodation part of the optical path control member in an inclination angle direction.

Referring to FIG. 20, a light conversion material 330 may be disposed inside the accommodation part 320. In detail, the light conversion material 330 and the first sealing part 510 may be disposed inside the accommodation part 320.

The first sealing part 510 may be disposed at one end and the other end of the accommodation part 320 in the second direction 2A to seal the light conversion material 330 disposed inside the accommodation part 320.

That is, at least one accommodation part among the plurality of accommodation parts of the light conversion unit may be disposed in contact with only the first sealing part 510.

The light conversion material 330 inside the accommodation part 320 may be sealed by the first sealing part 510, so that it is possible to inhibit the light conversion material 330 from flowing out to the outside of the optical path control member.

The first sealing part 510 disposed in the first hole h1-1 may be disposed in contact with the light conversion material 330. In addition, the first sealing part 510 disposed in the second holes h1-2 may be disposed in contact with the light conversion material 300 and a first mixing region 810.

The first mixing region 810 may be a region where a material of the dam part 600 removed during the manufacturing process of the optical path control member and a material of the first sealing part 510 are disposed to be mixed or separated.

That is, the first mixing region 810 may include the same or a different material from the first sealing part 510.

For example, when the materials of the first sealing part 510 and the dam part 600 include the same material, the first mixing region 810 may be a region where the first sealing part 510 extends.

Alternatively, when the materials of the first sealing part 510 and the dam part 600 include different materials, the first mixing region 810 may be a region where the materials of the first sealing part 510 and the dam part 600 are mixed or a region where the materials of the first sealing part 510 and the dam part 600 are separated while having an interface without being mixed with each other and disposed together.

By the first mixing region 810 disposed inside the accommodation part 320, it is possible to minimize the occurrence of air bubbles in the accommodation part 320.

That is, as an injection amount of the material of the dam part 600 varies in any one of the accommodation parts, a size of a space region between the first sealing part 510 and the dam part 600 may vary, and by disposing the sealing material of the first sealing part 510 inside such a space region in an appropriate amount, the inside of the accommodation part may be disposed to fill with the first sealing part 510, the light conversion material 330, and the like.

Accordingly, it is possible to inhibit the occurrence of air bubbles due to voids or the like inside the accommodation part 320 and the light leakage phenomenon or the like according thereto.

Meanwhile, referring to FIG. 20, like the first embodiment described above, the accommodation part 320 may include the first region 321 and the second region 322, and accordingly, the accommodation part 320 may include a region where the heights of the light conversion material are different.

Since the following description is the same as that of the first embodiment, the description thereof will be omitted.

Figure 21:
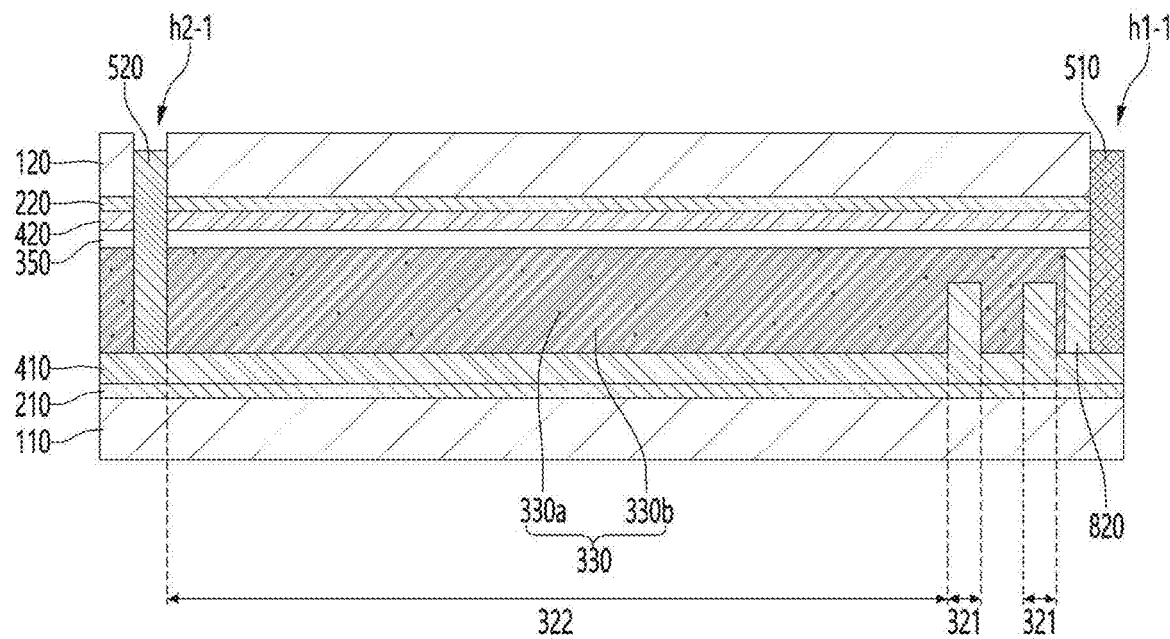
FIG. 21 is a cross-sectional view taken along line K-K' in FIG. 18.

FIG. 21 is a cross-sectional view taken along line K-K' in FIGS. 16 and 19. That is, FIG. 21 is a cross-sectional view taken the outermost accommodation part of the optical path control member in an inclination angle direction.

Referring to FIG. 21, a light conversion material 330 may be disposed inside the accommodation part 320. In detail, the light conversion material 330 and the first sealing part 510 and the second sealing part 520 may be disposed inside the accommodation part 320.

The first sealing part 510 and the second sealing part 520 may seal the light conversion material 330 disposed inside the accommodation part 320.

That is, the first sealing part 510 may seal an end in an outer surface direction in the second direction among ends of the accommodation part 320, and the second sealing part 520 may seal an end in an outer surface direction in the first direction among the ends of the accommodation part 320.

That is, at least one accommodation part among the plurality of accommodation parts of the light conversion unit may be disposed in contact with the first sealing part 510 and the second sealing part 520.

The light conversion material 330 inside the accommodation part 320 is sealed by the first sealing part 510 and the second sealing part 520, so that it is possible to inhibit the light conversion material from flowing out to the outside.

The first sealing part 510 disposed in the first hole h1-1 may be disposed in contact with the light conversion material 330. Alternatively, the first sealing part 510 disposed on the first hole h1-1 may be in contact with the light conversion material 330 and a second mixing region 820.

The second mixing region 820 may be a region where both the first sealing part 510 and the light conversion material 330 are included.

That is, in the first sealing part 510 disposed in the first hole h1-1, a part of the sealing material penetrates into the accommodation part 320 in a region overlapping the accommodation part 320, or, the light conversion material 330 may penetrate into the first hole h1-1.

In the second mixing region 820, the light conversion material 330 and the sealing material may be disposed to be phase-separated from each other or may be disposed to be mixed with each other.

In addition, in the first sealing part 510 disposed in the first hole h1-1, a part of the sealing material penetrates into the accommodation part 320 in the region overlapping the accommodation part 320. The first sealing part 510 may improve adhesive properties of the second sealing part by an anchoring effect, and thus it is possible to inhibit the second sealing part from being delaminated.

In addition, the second sealing part 520 disposed in the third hole h2-1 may be disposed in contact with the light conversion material 330. In detail, one surface of the second sealing part 520 facing the first sealing part may be in contact with the light conversion material 330. In addition, the light conversion material 330 may exist in a direction of the other surface opposite to the one surface to be in contact with the light conversion material 330. In addition, the second mixed region including both the light conversion material 330 and the sealing material may be disposed in the direction of the other surface opposite to the one surface.

Meanwhile, referring to FIG. 21, like the first embodiment described above, the accommodation part 320 may include the first region 321 and the second region 322, and accordingly, the accommodation part 320 may include a region where the heights of the light conversion material are different.

Since the following description is the same as that of the first embodiment, the description thereof will be omitted.

Figure 22:
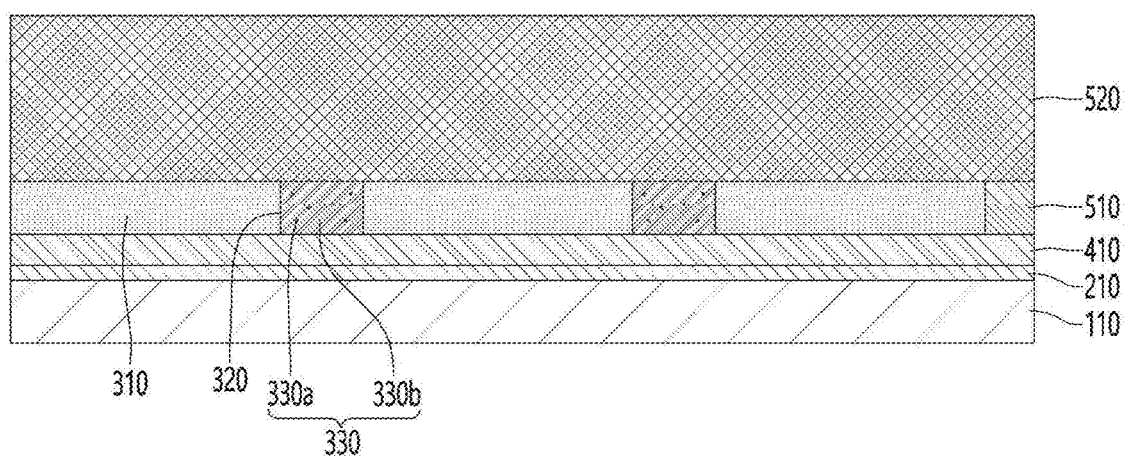
FIG. 22 is a cross-sectional view taken along line L-L' in FIG. 18.

FIG. 22 is a cross-sectional view taken along line L-L' in FIGS. 16 and 19. That is, FIG. 22 is a cross-sectional view taken along an extending direction of the second sealing part of the optical path control member.

Referring to FIG. 22, the second sealing part 520 may be formed to pass through the second substrate 120, the second electrode 220, and the buffer layer 410 and may be formed by removing a part of the accommodation part 320 and the partition wall 310. In addition, the second sealing part 520 may be formed to cross the accommodation part 320 and the partition part 310. That is, the partition part 310 and the accommodation part 320 may be alternately disposed under the second sealing part 520.

A light conversion material 330 may be disposed inside the accommodation part 320 that has not been removed. In detail, when the light conversion material 330 is filled in the accommodation part 320, one end of the light conversion material 330 inside the accommodation part 320 may be sealed by the first sealing part 510 to minimize the movement of the light conversion material. Subsequently, the light conversion material remaining in the accommodation part under the second sealing part may also be sealed by forming the third hole h2-1 and forming the second sealing part 520. That is, the second sealing part 520 may be in contact with side and upper surfaces of the light conversion material 330 and may seal the light conversion material 330.

Preferably, when the second sealing part is formed, both the accommodation part and the partition part are removed, so that it is possible to inhibit the light conversion material from flowing out to the outside.

Meanwhile, a third mixing region may be formed in a region where the second sealing part 520 and the accommodation part 320 overlap, that is, are in contact with each other.

The third mixing region may be a region where the second sealing part 520 and the light conversion material 330 are mixed.

That is, in the second sealing part 520 disposed in the third hole h2-1, a part of the sealing material penetrates into the accommodation part 320 in the region overlapping the accommodation part 320, or the light conversion material may penetrate into the third hole h2-1 to be mixed with the light conversion material 330.

Accordingly, the second sealing part 520 may improve the adhesive properties of the second sealing part by the anchor effect, and thus it is possible to inhibit the second sealing part from being delaminated.

Figure 18:
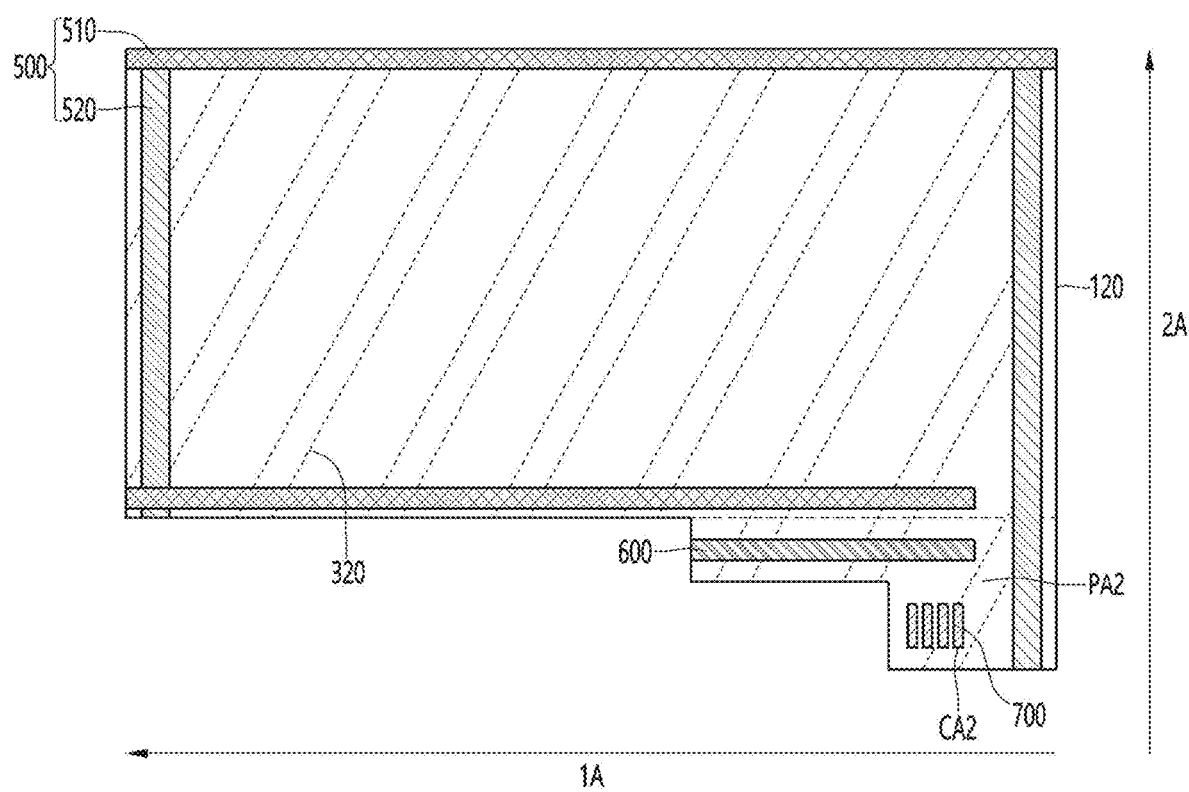
FIG. 18 is a top view of a second substrate of the optical path control member according to the second embodiment.

Meanwhile, FIG. 22 is an enlarged view of region A in FIG. 18. Referring to FIG. 22, one end in the first direction of at least one of the first sealing parts 510 disposed on the dam part 600 and the second h1-2 may be disposed to protrude more than one end of the second connection portion CA2 in the first direction.

In the optical path control member according to the second embodiment, the accommodation part may be disposed by tilting the accommodation part at an inclination angle of a predetermined size with respect to the second direction of the substrate.

Accordingly, when the optical path control member and the display panel are coupled to form the display device, it is possible to inhibit the occurrence of the moire phenomenon caused by overlapping the pattern of the accommodation part of the optical path controlling member and the pixel pattern of the display panel.

Accordingly, when the user views the display device from the outside, it is possible to inhibit the pattern from being visually recognized due to the moire phenomenon caused by the overlapping of the accommodation part pattern of the optical path control member and the pixel pattern of the display panel.

In addition, the optical path control member according to the second embodiment may inhibit flowing out to the side surface thereof that may occur as the accommodation part is inclined.

That is, since the first sealing part and the second sealing part are disposed at the ends of the optical path control member in the first and second directions to seal the optical conversion material inside the accommodation part, it is possible to minimize the optical conversion material flowing out to the outside or external impurities penetrating into the optical conversion material.

In addition, by forming a region where the sealing part and the optical conversion material are mixed, adhesive properties of the sealing part may be improved by the anchor effect. Accordingly, it is possible to improve the adhesion of the sealing part to inhibit delamination, thereby improving reliability and sealing properties of the optical path control member.

Hereinafter, referring to FIGS. 23 to 27, a display device to which an optical path control member according to an embodiment is applied will be described.

Figure 23:
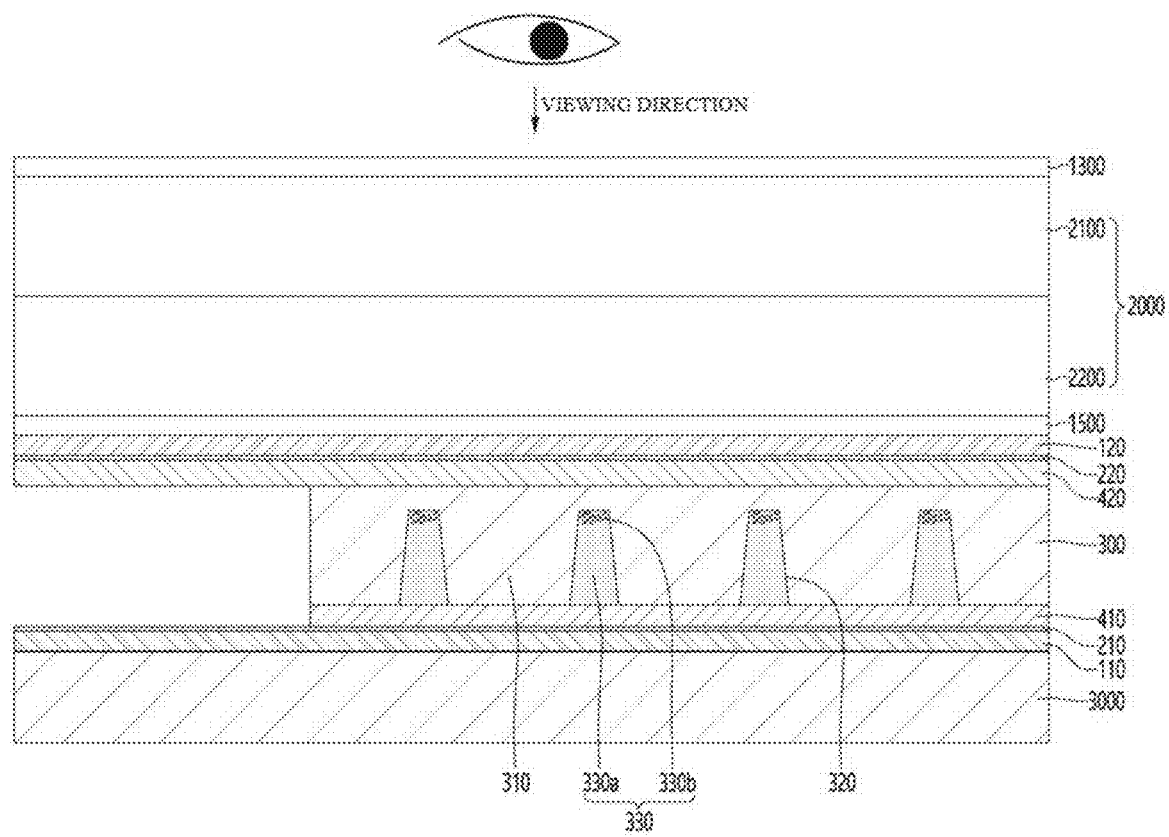
FIGS. 23 and 24 are cross-sectional views of a display device to which an optical path control member according to an embodiment is applied.
Figure 24:
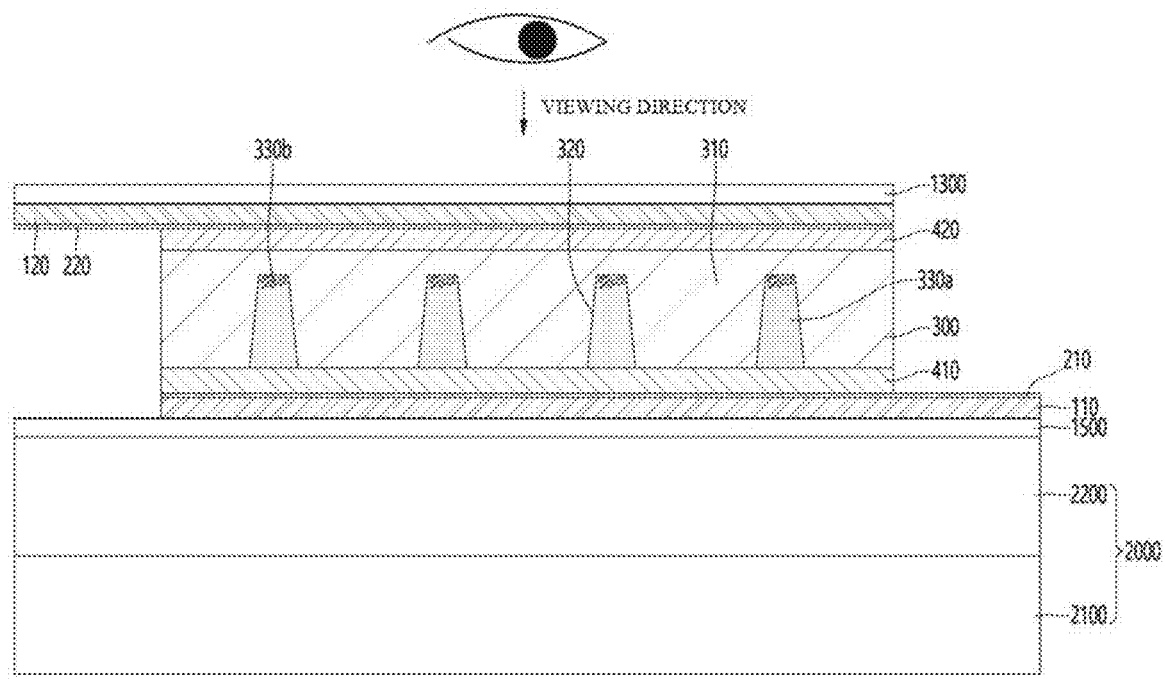

Referring to FIGS. 23 to 24, An optical path control member 1000 according to an embodiment may be disposed on or under a display panel 2000.

The display panel 2000 and the optical path control member 1000 may be disposed to be adhered to each other. For example, the display panel 2000 and the optical path control member 1000 may be adhered to each other via an adhesive layer 1500. The adhesive layer 1500 may be transparent. For example, the adhesive layer 1500 may include an adhesive or an adhesive layer including an optical transparent adhesive material.

The adhesive layer 1500 may include a release film. In detail, when adhering the optical path control member and the display panel, the optical path control member and the display panel may be adhered after the release film is removed.

The display panel 2000 may include a first' substrate 2100 and a second' substrate 2200. When the display panel 2000 is a liquid crystal display panel, the optical path control member may be formed under the liquid crystal panel. That is, when a surface viewed by the user in the liquid crystal panel is defined as an upper portion of the liquid crystal panel, the optical path control member may be disposed under the liquid crystal panel. The display panel 2000 may be formed in a structure in which the first' substrate 2100 including a thin film transistor (TFT) and a pixel electrode and the second' substrate 2200 including color filter layers are bonded to each other with a liquid crystal layer interposed therebetween.

In addition, the display panel 2000 may be a liquid crystal display panel of a color filter on transistor (COT) structure in which a thin film transistor, a color filter, and a black electrolyte are formed at the first' substrate 2100 and the second' substrate 2200 is bonded to the first' substrate 2100 with the liquid crystal layer interposed therebetween. That is, a thin film transistor may be formed on the first' substrate 2100, a protective film may be formed on the thin film transistor, and a color filter layer may be formed on the protective film. In addition, a pixel electrode in contact with the thin film transistor may be formed on the first' substrate 2100. At this point, in order to improve an aperture ratio and simplify a masking process, the black electrolyte may be omitted, and a common electrode may be formed to function as the black electrolyte.

In addition, when the display panel 2000 is the liquid crystal display panel, the display device may further include a backlight unit 3000 providing light from a rear surface of the display panel 2000.

That is, as shown in FIG. 23, the optical path control member may be disposed under the liquid crystal panel and on the backlight unit 3000, and the optical path control member may be disposed between the backlight unit 3000 and the display panel 2000.

Alternatively, as shown in FIG. 24, when the display panel 2000 is an organic light emitting diode panel, the optical path control member may be formed on the organic light emitting diode panel. That is, when the surface viewed by the user in the organic light emitting diode panel is defined as an upper portion of the organic light emitting diode panel, the optical path control member may be disposed on the organic light emitting diode panel. The display panel 2000 may include a self-luminous element that does not require a separate light source. In the display panel 2000, a thin film transistor may be formed on the first' substrate 2100, and an organic light emitting element in contact with the thin film transistor may be formed. The organic light emitting element may include an anode, a cathode, and an organic light emitting layer formed between the anode and the cathode. In addition, the second' substrate 2200 configured to function as an encapsulation substrate for encapsulation may be further included on the organic light emitting element.

In addition, although not shown in drawings, a polarizing plate may be further disposed between the optical path control member 1000 and the display panel 2000. The polarizing plate may be a linear polarizing plate or an external light reflection preventive polarizing plate. For example, when the display panel 2000 is a liquid crystal display panel, the polarizing plate may be the linear polarizing plate. Further, when the display panel 2000 is the organic light emitting diode panel, the polarizing plate may be the external light reflection inhibiting polarizing plate.

In addition, an additional functional layer 1300 such as an anti-reflection layer, an anti-glare, or the like may be further disposed on the optical path control member 1000. Specifically, the functional layer 1300 may be adhered to one surface of the first substrate 110 of the optical path control member. Although not shown in drawings, the functional layer 1300 may be adhered to the first substrate 110 of the optical path control member via an adhesive layer. In addition, a release film for protecting the functional layer may be further disposed on the functional layer 1300.

Further, a touch panel may be further disposed between the display panel and the optical path control member.

It is illustrated in the drawings that the optical path control member is disposed at an upper portion of the display panel, but the embodiment is not limited thereto, and the optical path control member may be disposed at various positions such as a position in which light is adjustable, that is, a lower portion of the display panel, or between a second substrate and a first substrate of the display panel, or the like.

In addition, it is shown in the drawings that the light conversion unit of the optical path control member according to the embodiment is in a direction parallel or perpendicular to an outer surface of the second substrate, but the light conversion unit is formed to be inclined at a predetermined angle from the outer surface of the second substrate. Through this, a moire phenomenon occurring between the display panel and the optical path control member may be reduced.

Figure 27:

Referring to FIGS. 25 to 27, An optical path control member according to an embodiment may be applied to various display devices.

Referring to FIGS. 25 to 27, the optical path control member according to the embodiment may be applied to a display device that displays a display.

For example, when power is applied to the optical path control member as shown in FIG. 25, the accommodation part functions as the light transmitting part, so that the display device may be driven in the public mode, and when power is not applied to the optical path control member as shown in FIG. 26, the accommodation part functions as the light blocking part, so that the display device may be driven in the light blocking mode.

Accordingly, a user may easily drive the display device in a privacy mode or a normal mode according to application of power.

Light emitted from the backlight unit or the self-luminous element may move from the first substrate toward the second substrate. Alternatively, the light emitted from the backlight unit or the self-luminous element may also move from the second substrate toward the first substrate.

In addition, referring to FIG. 27, the display device to which the optical path control member according to the embodiment is applied may also be applied inside a vehicle.

For example, the display device including the optical path control member according to the embodiment may display a video confirming information of the vehicle and a movement route of the vehicle. The display device may be disposed between a driver seat and a passenger seat of the vehicle.

In addition, the optical path control member according to the embodiment may be applied to a dashboard that displays a speed, an engine, an alarm signal, and the like of the vehicle.

Further, the optical path control member according to the embodiment may be applied to a front glass (FG) of the vehicle or right and left window glasses.

The characteristics, structures, effects, and the like described in the above-described embodiments are included in at least one embodiment of the present invention, but are not limited to only one embodiment. Furthermore, the characteristic, structure, and effect illustrated in each embodiment may be combined or modified for other embodiments by a person skilled in the art. Accordingly, it is to be understood that such combination and modification are included in the scope of the present invention.

In addition, embodiments are mostly described above, but the embodiments are merely examples and do not limit the present invention, and a person skilled in the art may appreciate that several variations and applications not presented above may be made without departing from the essential characteristic of embodiments. For example, each component specifically represented in the embodiments may be varied. In addition, it should be construed that differences related to such a variation and such an application are included in the scope of the present invention defined in the following claims.

The invention claimed is:

1. An optical path control member comprising:
  a first substrate on which a first direction and a second direction are defined;
  a first electrode disposed on the first substrate;
  a second substrate disposed on the first substrate, and on which the first direction and the second direction are defined;
  a second electrode disposed under the second substrate; and
  a light conversion unit disposed between the first electrode and the second electrode,
  wherein the second substrate includes a first hole, a second hole, a third hole, and a fourth hole, and
  wherein sealing parts are disposed inside the first hole, the second hole, the third hole, and the fourth hole.

2. The optical path control member of claim 1, wherein the light conversion unit includes a plurality of partition wall parts spaced apart from each other in the first direction and a plurality of accommodation parts alternately disposed,
  wherein a light conversion material is disposed in each accommodation part, and
  wherein the light conversion material has different heights along the second direction.

3. The optical path control member of claim 2, wherein each accommodation part includes at least one first region and at least one second region along the second direction,
  wherein a height of the light conversion material disposed in the first region is smaller than that of the light conversion material disposed in the second region,
  wherein the sealing parts include a first sealing part disposed in the first hole and the second hole,
  wherein one end and an other end of the accommodation part are disposed to face the first sealing part, and
  wherein the first region is disposed closer to the first sealing part than is the second region.

4. The optical path control member of claim 3, wherein a height of the light conversion material disposed in the first region is 10% to 99.9% of a height of the light conversion material disposed in the second region.

5. The optical path control member of claim 3, comprising an adhesive layer disposed between the first electrode and the light conversion unit, and
  a thickness of an adhesive layer in the first region is greater than that of an adhesive layer in the second region.

6. The optical path control member of claim 3, comprising a buffer layer disposed between the second electrode and the light conversion unit, wherein
  the light conversion unit includes a base part between the buffer layer and the accommodation part, and
  a thickness of a base part of the first region is greater than that of a base part of the second region.

7. The optical path control member of claim 3, wherein the first sealing part is in contact with the light conversion material.

8. The optical path control member of claim 3, wherein the first region is disposed between the second region and the first sealing part.

9. The optical path control member of claim 3, wherein a width of the first region is 0.1% to 20% of a total width of the accommodation part in the second direction.

10. The optical path control member of claim 9, wherein the width of the first region is 0.001 mm to 20 mm.

11. A display device comprising:
a panel including at least one of a display panel and a touch panel; and
the optical path control member of claim 1, which is disposed on or under the panel.

12. The display device of claim 11, wherein the panel includes a backlight unit and a liquid crystal display panel,
the optical path control member is disposed between the backlight unit and the liquid crystal display panel, and
light emitted from the backlight unit moves in a direction of the second substrate from the first substrate.

13. The display device of claim 11 wherein the panel includes an organic light emitting diode panel,
the optical path control member is disposed on the organic light emitting diode panel, and
light emitted from the panel moves in a direction of the second substrate from the first substrate.

14. The optical path control member of claim 13, wherein an open region is formed between the second hole and the fourth hole.

15. The optical path control member of claim 14, configured so that a current and a voltage can be transferred toward the accommodation part through the second electrode by the open region.

16. The optical path control member of claim 1, wherein a first sealing part is disposed in the first hole,
a second sealing part is disposed in the second hole, and
at least one of the first sealing part and the second sealing part is an outermost surface of the optical path control member.

* * * * *